United States Patent
Hatanaka

(10) Patent No.: US 12,196,700 B2
(45) Date of Patent: Jan. 14, 2025

(54) MEASURING METHOD, MEASURING DEVICE, AND MEASURING SYSTEM

(71) Applicant: Tokyo Electron Limited, Tokyo (JP)

(72) Inventor: Takayuki Hatanaka, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 143 days.

(21) Appl. No.: 18/170,429

(22) Filed: Feb. 16, 2023

(65) Prior Publication Data

US 2023/0266261 A1 Aug. 24, 2023

(30) Foreign Application Priority Data

Feb. 21, 2022 (JP) ................................ 2022-024756
Jan. 18, 2023 (JP) ................................ 2023-006107

(51) Int. Cl.
*G01N 27/22* (2006.01)

(52) U.S. Cl.
CPC .................................. *G01N 27/22* (2013.01)

(58) Field of Classification Search
CPC .. G01N 27/22; G01N 27/221; G01N 27/2605; G01R 31/2831; G01R 31/2862; G01R 31/2891; G01R 31/2893; G01R 19/16528; G01R 19/25; G01R 35/007; G01K 1/02
See application file for complete search history.

(56) References Cited

U.S. PATENT DOCUMENTS

| 2016/0363433 A1* | 12/2016 | Sugita | ................ G01R 27/2605 |
| 2018/0284171 A1* | 10/2018 | Sugita | ................ G01R 27/2605 |
| 2019/0277665 A1* | 9/2019 | Sugita | .................. G01D 5/2405 |
| 2020/0363459 A1* | 11/2020 | Kawano | ............ G01R 27/2605 |

FOREIGN PATENT DOCUMENTS

JP 2020-190539 A 11/2020

\* cited by examiner

*Primary Examiner* — Lee E Rodak
*Assistant Examiner* — Demetrius R Pretlow
(74) *Attorney, Agent, or Firm* — Studebaker & Brackett PC

(57) ABSTRACT

A measuring method according to an exemplary embodiment includes acquiring a temperature by a temperature sensor at a first time, and acquiring a first parameter that sets an admittance of a phase adjustment circuit. The measuring method includes acquiring a second parameter corresponding to the temperature acquired at the first time. The second parameter is generated based on a second parameter group that is pre-stored. The measuring method includes acquiring a correction parameter group by correcting a second parameter group to correspond to the first parameter based on the first parameter and the second parameter.

15 Claims, 13 Drawing Sheets

*Fig.11*

| TEMPERATURE [°C] | PARAMETER OF RESISTANCE VALUE | PARAMETER OF ELECTROSTATIC CAPACITANCE VALUE |
|---|---|---|
| 23.6 | 11069 | 38872 |
| 26.5 | 11051 | 38888 |
| 29.3 | 11113 | 38904 |
| 33.3 | 10990 | 38917 |
| 36.8 | 10872 | 38930 |
| 39.4 | 10757 | 38947 |
| 42.6 | 10627 | 38959 |
| 46 | 10615 | 38972 |
| 49.5 | 10500 | 38988 |
| 52.5 | 10432 | 38994 |
| 55.2 | 10389 | 39006 |
| 58.5 | 10323 | 39006 |
| 60.9 | 10232 | 39017 |
| 64 | 10206 | 39023 |
| 67.1 | 10198 | 39042 |
| 69.3 | 10214 | 39039 |
| 71.4 | 10116 | 39043 |
| 74.1 | 10092 | 39044 |
| 77.1 | 9969 | 39064 |

Fig.12

| TEMPERATURE [°C] | PARAMETER OF RESISTANCE VALUE | PARAMETER OF ELECTROSTATIC CAPACITANCE VALUE |
|---|---|---|
| 23.6 | 11098 | 38891 |
| 26.5 | 11080 | 38907 |
| 29.3 | 11142 | 38923 |
| 33.3 | 11019 | 38936 |
| 36.8 | 10901 | 38949 |
| 39.4 | 10786 | 38966 |
| 42.6 | 10656 | 38978 |
| 46 | 10644 | 38991 |
| 49.5 | 10529 | 39007 |
| 52.5 | 10461 | 39013 |
| 55.2 | 10418 | 39025 |
| 58.5 | 10352 | 39025 |
| 60.9 | 10261 | 39036 |
| 64 | 10235 | 39042 |
| 67.1 | 10227 | 39061 |
| 69.3 | 10243 | 39058 |
| 71.4 | 10145 | 39062 |
| 74.1 | 10121 | 39063 |
| 77.1 | 9998 | 39083 |

MEASURING METHOD, MEASURING DEVICE, AND MEASURING SYSTEM

CROSS-REFERENCE TO RELATED APPLICATIONS

This application is based on and claims the benefit of priority from Japanese Patent Application Nos. 2022-024756 filed on Feb. 21, 2022, and 2023-006107 filed on Jan. 18, 2023, the entire contents of which are incorporated herein by reference.

TECHNICAL FIELD

An exemplary embodiment of the present disclosure relates to a measuring device.

BACKGROUND

Japanese Patent Application Laid-Open No. 2020-190539 discloses a measuring device for electrostatic capacitance measurement. The measuring device stores parameters for adjusting admittances of each of the plurality of phase adjustment circuits at each of a plurality of temperatures, and adjusts the admittances using parameters according to the temperature detected by a temperature sensor.

SUMMARY

One exemplary embodiment provides a measuring method of measuring electrostatic capacitance between a measuring device and an object. The measuring device includes a base board, a sensor electrode, a temperature sensor, a radio frequency oscillator, a C/V conversion circuit, and a phase adjustment circuit. The base board has a disc shape. The sensor electrode is provided on the base board. The temperature sensor is provided on the base board. The radio frequency oscillator is provided to apply a radio frequency signal to the sensor electrode. The C/V conversion circuit generates a voltage signal according to electrostatic capacitance formed by the sensor electrode. The phase adjustment circuit is connected between the sensor electrode and the radio frequency oscillator. The C/V conversion circuit has an amplifier circuit including an operational amplifier. The radio frequency oscillator is connected to a non-inversion input terminal of the operational amplifier such that the radio frequency signal is input to the non-inversion input terminal, and is connected to an inversion input terminal of the operational amplifier via the phase adjustment circuit. A measuring method includes acquiring a temperature by a temperature sensor at a first time, and acquiring a first parameter that sets an admittance of the phase adjustment circuit in order to adjust a voltage signal output from a C/V conversion circuit to a reference point. The measuring method includes acquiring a second parameter that sets an admittance of the phase adjustment circuit, which corresponds to the temperature acquired at the first time. The second parameter is generated based on a second parameter group that is pre-stored and sets an admittance of the phase adjustment circuit by corresponding to each of a plurality of temperatures in order to adjust the voltage signal output from the C/V conversion circuit to the reference point. The measuring method includes acquiring a correction parameter group by correcting a second parameter group to correspond to the first parameter based on the first parameter and the second parameter. The measuring method includes acquiring a correction parameter corresponding to a temperature that is newly acquired by the temperature sensor based on the correction parameter group at a second time after the first time. The measuring method includes adjusting the voltage signal output from the C/V conversion circuit to the reference point by setting the admittance of the phase adjustment circuit using the acquired correction parameter.

BRIEF DESCRIPTION OF THE DRAWINGS

FIG. 11 is a table showing an example of a reference parameter group.
FIG. 12 is a table showing an example of a correction parameter group.

DETAILED DESCRIPTION

Figure 1:
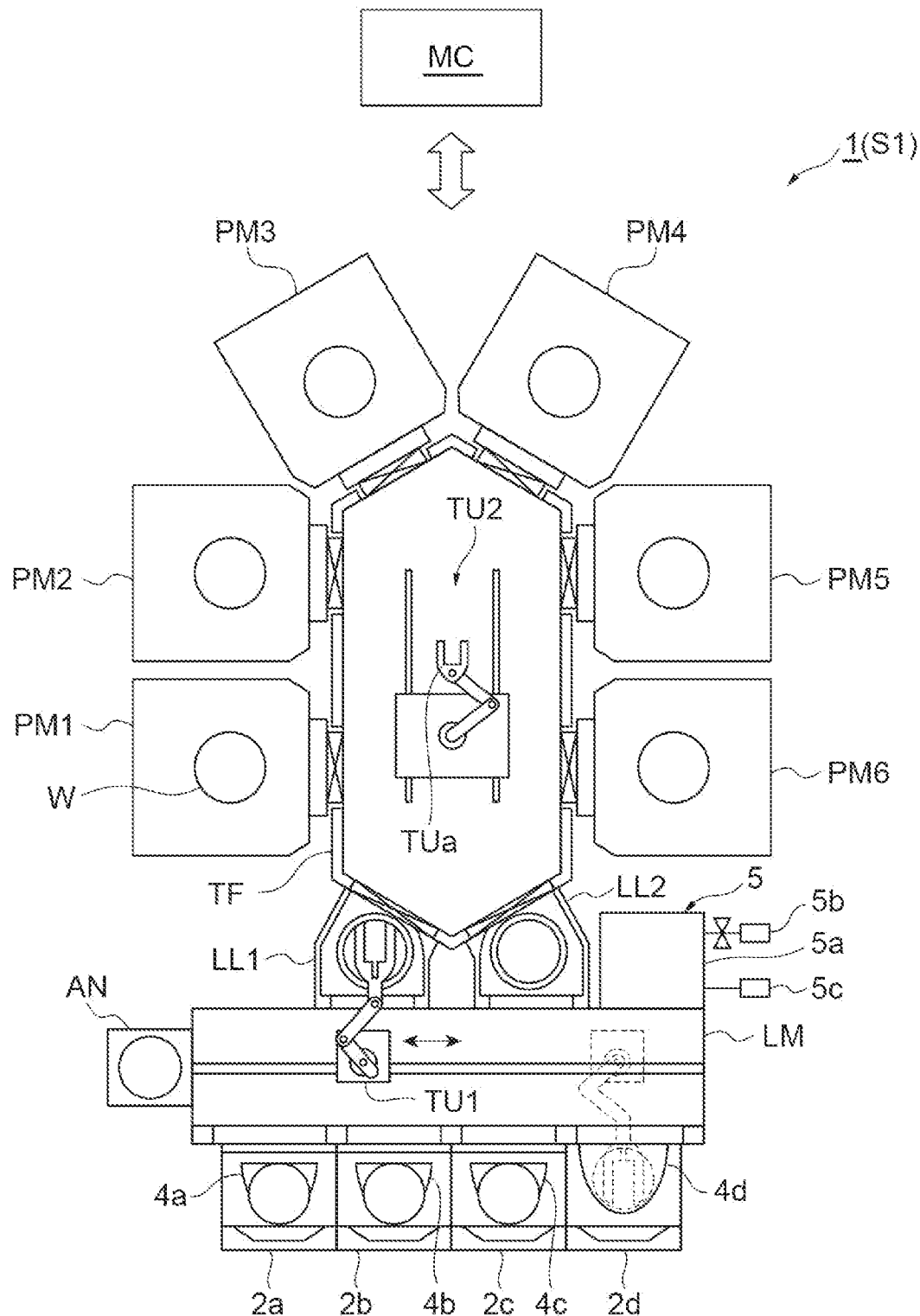
FIG. 1 is a diagram illustrating a processing system.

Hereinafter, various exemplary embodiments will be described.

One exemplary embodiment provides a measuring method of measuring electrostatic capacitance between a measuring device and an object. The measuring device includes a base board, a sensor electrode, a temperature sensor, a radio frequency oscillator, a C/V conversion circuit, and a phase adjustment circuit. The baseboard has a disc shape. The sensor electrode is provided on the base board. The temperature sensor is provided on the base board. The radio frequency oscillator is provided to apply a radio frequency signal to the sensor electrode. The C/V conversion circuit generates a voltage signal according to electrostatic capacitance formed by the sensor electrode. The phase adjustment circuit is connected between the sensor electrode and the radio frequency oscillator. The C/V conversion circuit has an amplifier circuit including an operational amplifier. The radio frequency oscillator is connected to a non-inversion input terminal of the operational amplifier such that the radio frequency signal is input to the non-inversion input terminal, and is connected to an inversion input terminal of the operational amplifier via the phase adjustment circuit. A measuring method includes acquiring a temperature by a temperature sensor at a first time, and acquiring a first parameter that sets an admittance of the phase adjustment circuit in order to adjust a voltage signal output from a C/V conversion circuit to a reference point. The measuring method includes acquiring a second parameter that sets an admittance of the phase adjustment circuit, which corresponds to the temperature acquired at the first time. The second parameter is generated based on a second parameter group that is pre-stored and sets an admittance of the phase adjustment circuit by corresponding to each of a plurality of temperatures in order to adjust the voltage signal output from the C/V conversion circuit to the reference point. The measuring method includes acquiring a correction parameter group by correcting a second parameter group to correspond to the first parameter based on the first parameter and the second parameter. The measuring method includes acquiring a correction parameter corresponding to a temperature that is newly acquired by the temperature sensor based on the correction parameter group at a second time after the first time. The measuring method includes adjusting the voltage signal output from the C/V conversion circuit to the reference point by setting the admittance of the phase adjustment circuit using the acquired correction parameter.

One exemplary embodiment provides a measuring device. The measuring device includes a base board, a sensor electrode, a temperature sensor, a radio frequency oscillator, a C/V conversion circuit, an A/D converter, an arithmetic device, and a phase adjustment circuit. The base board has a disc shape. The sensor electrode is provided on the base board. The temperature sensor is provided on the base board. The radio frequency oscillator is provided to apply a radio frequency signal to the sensor electrode. The C/V conversion circuit generates a voltage signal according to electrostatic capacitance formed by the sensor electrode. The A/D converter converts the voltage signal output from the C/V conversion circuit into a digital value. The arithmetic device calculates a measurement value representing electrostatic capacitance formed by the sensor electrode based on the digital value output from the A/D converter. The phase adjustment circuit is connected between the sensor electrode and the radio frequency oscillator. The C/V conversion circuit has an amplifier circuit including an operational amplifier. The radio frequency oscillator is connected to a non-inversion input terminal of the operational amplifier such that the radio frequency signal is input to the non-inversion input terminal, and is connected to an inversion input terminal of the operational amplifier via the phase adjustment circuit. The arithmetic device acquires a temperature by a temperature sensor at a first time, and acquires a first parameter that sets an admittance of the phase adjustment circuit in order to adjust a voltage signal output from a C/V conversion circuit to a reference point. The arithmetic device acquires a second parameter that sets an admittance of the phase adjustment circuit, which corresponds to the temperature acquired at the first time. The second parameter is acquired based on a second parameter group that is pre-stored and sets an admittance of the phase adjustment circuit by corresponding to each of a plurality of temperatures in order to adjust the voltage signal output from the C/V conversion circuit to the reference point. The arithmetic device acquires a correction parameter group by correcting a second parameter group to correspond to the first parameter based on the first parameter and the second parameter. The arithmetic device acquires a correction parameter corresponding to a temperature that is newly acquired by the temperature sensor based on the correction parameter group at a second time after the first time. The arithmetic device adjusts the voltage signal output from the C/V conversion circuit to the reference point by setting the admittance of the phase adjustment circuit using the acquired correction parameter.

One exemplary embodiment provides a measuring system. The measuring system includes a processing system, a measuring device, one or more control devices configured to control operations of the processing system and the measuring device. The processing system has a process module, a transfer module, and a keeping device. The process module includes a chamber body providing a first chamber and a stage provided in the first chamber. The process module has the stage on which the measuring device is mounted and an edge ring disposed on the stage. The edge ring surrounds a mounting region where the measuring device is mounted. The transfer module is airtightly connected to the process module. The transfer module has a decompression chamber configured to be decompressed, and a transport device provided in the decompression chamber and configured to transport the measuring device based on transport position data. The keeping device is airtightly connected to the decompression chamber. The keeping device has a second chamber having the measuring device kept therein. The measuring device includes a base board, a sensor electrode, a temperature sensor, a radio frequency oscillator, a C/V conversion circuit, an A/D converter, and a phase adjustment circuit. The base board has a disc shape. The sensor electrode is provided on the base board. The temperature sensor is provided on the base board. The radio frequency oscillator is provided to apply a radio frequency signal to the sensor electrode. The C/V conversion circuit generates a voltage signal according to electrostatic capacitance formed by the sensor electrode. The A/D converter converts the voltage signal output from the C/V conversion circuit into a digital value. The phase adjustment circuit is connected between the sensor electrode and the radio frequency oscillator. The C/V conversion circuit has an amplifier circuit including an operational amplifier. The radio frequency oscillator is connected to a non-inversion input terminal of the operational amplifier such that the radio frequency signal is input to the non-inversion input terminal, and is connected to an inversion input terminal of the operational amplifier via the phase adjustment circuit. The one or more control devices acquire a temperature by a temperature sensor at a first time, and acquire a first parameter that sets an admittance of the phase adjustment circuit in order to adjust a voltage signal output from a C/V conversion circuit to a reference point. The one or more control devices acquire a second parameter that sets an admittance of the phase adjustment circuit, which corresponds to the temperature acquired at the first time. The second parameter is acquired based on a second parameter group that is pre-stored and sets an admittance of the phase adjustment circuit by corresponding to each of a plurality of temperatures in order to adjust the voltage signal output from the C/V conversion circuit to the reference point. The one or more control devices acquire a correction parameter group by correcting a second parameter group to correspond to the first parameter based on the first parameter and the second parameter. The one or more control devices acquire a correction parameter corresponding to a temperature that is newly acquired by the temperature sensor based on the correction parameter group at a second time after the first time. The one or more control devices adjust the voltage signal output from the C/V conversion circuit to the reference point by setting the admittance of the phase adjustment circuit using the acquired correction parameter. The one or more control devices calculate a measurement value representing electrostatic capacitance formed by the sensor electrode, based on the digital value output from the A/D converter in a state where the voltage signal output from the C/V conversion circuit is adjusted to the reference point.

In the embodiment, the radio frequency oscillator is connected to a non-inversion input terminal of the operational amplifier such that the radio frequency signal is input to the non-inversion input terminal, and is connected to an inversion input terminal of the operational amplifier via the phase adjustment circuit. Therefore, the admittance of the phase adjustment circuit is adjusted so that magnitudes of voltage signals output from a plurality of C/V conversion circuits are adjusted. The magnitudes of the voltage signals output from the plurality of C/V conversion circuits may fluctuate depending on an ambient temperature or the like. Therefore, the measuring device acquires a first parameter that sets an admittance of the phase adjustment circuit, which corresponds to the temperature at the first time, in order to adjust the voltage signal output from the C/V conversion circuit to the reference point. On the other hand, the measuring device acquires a second parameter that pre-stores a second parameter group for setting an admittance of the phase adjustment circuit and corresponds to the temperature at the first time based on the second parameter group. Under the normal case, the first parameter and the second parameter have the same value because the first parameter and the second parameter correspond to the same temperature. However, two values may differ from each other because a state of the measuring device when acquiring the first parameter is different from a state of the measuring device when acquiring the second parameter group. Therefore, the measuring device acquires a correction parameter group according to a plurality of temperatures by correcting the second parameter group based on the first parameter and the second parameter. Since the admittance is adjusted using the correction parameter group, the voltage signal can be easily adjusted according to the states of the measuring device and an ambient temperature at that time.

In one exemplary embodiment, in the acquiring of the correction parameter group, a difference between the first parameter and the second parameter may be calculated, and the plurality of parameters corresponding to the plurality of temperatures and constituting the second parameter group may be adjusted using the calculated difference. With this configuration, a plurality of parameters, which are elements of the second parameter, can be uniformly corrected.

In one exemplary embodiment, in the acquiring of the second parameter, the second parameter corresponding to the temperature acquired at the first time may be acquired based on data, which is acquired by linear interpolating the plurality of parameters corresponding to the plurality of temperatures and constituting the second parameter group. With this configuration, even if a large amount of data is not acquired as the second parameter group, the second parameter can be acquired based on data that is linearly interpolated between data, so that the number of elements constituting the second parameter group can be reduced.

In one exemplary embodiment, the second parameter group may be acquired by the measuring device under an environment with a humidity of 10% or less for one day or longer. With this configuration, the second parameter group can be acquired in a state similar to a usage environment of the measuring device.

In one exemplary embodiment, the transfer module may have the edge ring disposed on the stage, which is replaceable with the other edge ring. The one or more control devices can control the transfer module such that the measuring device is mounted in a region surrounded by another edge ring on the stage after replacing the edge ring with the other edge ring. With this configuration, a transport position of the edge ring can be confirmed by the measuring device after replacing the edge ring.

In one exemplary embodiment, the measuring device may be kept in a dehumidified environment within a second chamber of the keeping device. With this configuration, the measuring device can be kept in a state similar to the usage environment.

In one exemplary embodiment, the one or more control devices may obtain an amount of deviation of a center of the measuring device relative to a center of the edge ring, based on the calculated measurement values representing electrostatic capacitance. The one or more control devices may calibrate transport position data based on the amount of deviation and control the transfer module such that a workpiece is transported based on the calibrated transport position data. With this configuration, accuracy of the transport position by the transfer module is enhanced.

In one exemplary embodiment, the one or more control devices may obtain an amount of deviation of a center of the measuring device relative to a center of the mounting region, based on the calculated measurement values representing electrostatic capacitance. The one or more control devices may calibrate transport position data based on the amount of deviation and control the transfer module such that a workpiece is transported based on the calibrated transport position data. With this configuration, accuracy of the transport position by the transfer module is enhanced.

In one exemplary embodiment, the one or more control devices may obtain an amount of deviation of a center of the edge ring relative to the center of the mounting region, based on the calculated measurement values representing electrostatic capacitance. The one or more control devices may calibrate the transport position data based on the amount of deviation, and control the transfer module such that a mounting position of the edge ring is changed based on the calibrated transport position data. With this configuration, accuracy of the transport position by the transfer module is enhanced.

In one exemplary embodiment, the process module may include a lift pin that lifts the edge ring. The one or more control devices may control the process module such that the lift pin lifts the edge ring when the mounting position of the edge ring is changed. The one or more control devices may control the transfer module to receive the edge ring lifted by the lift pin and remount the received edge ring on the stage based on the calibrated transport position data. With this configuration, accuracy of the transport position of the edge ring is enhanced.

Hereinafter, various embodiments will be described in detail with reference to the drawings. The same reference numerals will be given to the same or corresponding parts in each drawing.

The measuring device according to one exemplary embodiment can be transported by a processing system 1 that has a function as a transport system S1. First, a processing system that includes a processing device for processing a workpiece and a transport device for transporting the workpiece to the processing device will be described. FIG. 1 is a diagram illustrating a processing system. The processing system 1 includes tables 2a to 2d, containers 4a to 4d, a loader module LM, an aligner AN, a load lock modules LL1 and LL2, a process modules PM1 to PM6, a transfer module TF, a controller MC, and a keeping device 5. The number of tables 2a to 2d, the number of containers 4a to 4d, the number of load lock modules LL1 and LL2, and the number of process modules PM1 to PM6 are not limited, and any number of equal to or greater than one can be used.

The tables 2a to 2d are arranged along one edge of the loader module LM. The containers 4a to 4d are mounted on the tables 2a to 2d, respectively. Each of the containers 4a to 4d is, for example, a container called a front opening unified pod (FOUP). Each of the containers 4a to 4d can be configured to accommodate the workpiece W. The workpiece W has a substantially disc shape like a wafer.

Inside of the loader module LM, there is a chamber wall that defines a transport space under atmospheric pressure. A transport device TU1 is provided in this transport space. The transport device TU1 is, for example, an articulated robot and is controlled by the controller MC. The transport device TU1 is configured to transport the workpiece W between the containers 4a to 4d and the aligner AN, between the aligner AN and the load lock modules LL1 to LL2, and between the load lock modules LL1 to LL2 and the containers 4a to 4d.

Figure 2:
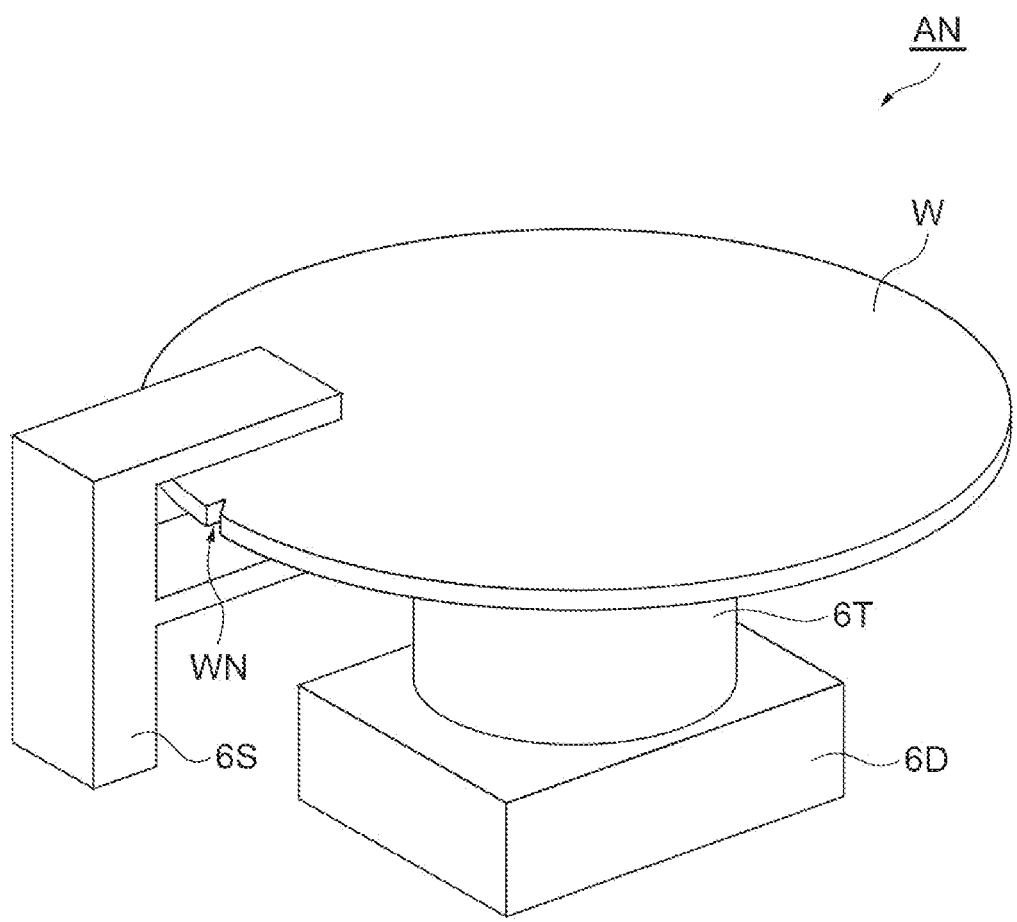
FIG. 2 is a perspective view illustrating an aligner.

The aligner AN is connected to the loader module LM. The aligner AN is configured to adjust the position of the workpiece W (calibrate the position). FIG. 2 is a perspective view illustrating an aligner. The aligner AN includes a support stand 6T, a drive device 6D, and a sensor 6S. The support stand 6T is a stand that can rotate around the axis extending in the vertical direction. The support stand 6T is configured to support the workpiece W thereon. The support stand 6T is rotated by the drive device 6D. The drive device 6D is controlled by the controller MC. When the support stand 6T is rotated due to the power from the drive device 6D, the workpiece W mounted on the support stand 6T is also rotated.

The sensor 6S is an optical sensor. The sensor 6S detects the edge of the workpiece W while the workpiece W is rotated. From the result of detecting the edge, the sensor 6S detects an amount of deviation of an angle position of a notch WN (or another marker) of the workpiece W with respect to a reference angle position and an amount of deviation of a center position of the workpiece W with respect to the reference position. The sensor 6S outputs the amount of deviation of the angle position of the notch WN and the amount of deviation of the center position of the workpiece W to the controller MC. The controller MC calculates an amount of rotation of the support stand 6T for correcting the angle position of the notch WN to the reference angle position based on the amount of deviation of the angle position of the notch WN. The controller MC controls the drive device 6D to rotate the support stand 6T as much as the amount of rotation. In this way, the angle position of the notch WN can be corrected to the reference angle position. In addition, the controller MC controls a position of an end effector of the transport device TU1 when receiving the workpiece W from the aligner AN based on the amount of deviation of the center position of the workpiece W. In this way, the center position of the workpiece W coincides with the predetermined position on the end effector of the transport device TU1.

Returning to FIG. 1, each of the load lock module LL1 and the load lock module LL2 is provided between the loader module LM and the transfer module TF. Each of the load lock module LL1 and the load lock module LL2 provides a preliminary decompression chamber.

The transfer module TF is airtightly connected to the load lock module LL1 and the load lock module LL2 via a gate valve. The transfer module TF provides a decompression chamber capable of reducing pressure. A transport device TU2 is provided in this decompression chamber. The transport device TU2 is, for example, an articulated robot having a transport arm TUa. The transport device TU2 is controlled by the controller MC. The transport device TU2 is configured to transport the workpiece W between the load lock modules LL1 to LL2 and the process modules PM1 to PM6, and between any two process modules of the process modules PM1 to PM6.

The process modules PM1 to PM6 are airtightly connected to the transfer module TF via the gate valve. Each of the process modules PM1 to PM6 is a processing device configured to perform a dedicated process such as plasma processing on the workpiece W.

The keeping device 5 can keep a measuring device 100, which will be described later, under a dehumidified environment. As illustrated in FIG. 1, the keeping device 5 includes a chamber 5a (second chamber) providing a sealable internal space therein, a gas supply device 5b connected to the chamber 5a via a valve, and an exhaust device 5c connected to the chamber 5a. For example, the keeping device 5 may be installed adjacent to the loader module LM. In this case, the chamber 5a may be connected to a transport space of the loader module LM via a gate through which the measuring device 100 can pass. When the gate is open, a space within the chamber 5a and the transport space within the loader module LM are connected. When the gate is closed, the space within the chamber 5a can be sealed. The measuring device 100 can be transported by the transport device TU1 in a state where the gate of the chamber 5a is opened. For example, the transport device TU1 may transport the measuring device 100 between the load lock modules LL1 and LL2 and the chamber 5a via the loader module LM.

The gas supply device 5b can supply moisture-free purge gas into the chamber 5a. The purge gas may be, for example, an inert gas such as nitrogen gas. The exhaust device 5c is a device for exhausting the gas inside the chamber 5a to an outside. For example, the exhaust device 5c may be a vacuum pump capable of reducing a pressure in the chamber 5a to a desired degree of vacuum.

For example, the purge gas is supplied from the gas supply device 5b into the chamber 5a, so that the internal space of the chamber 5a can become a dehumidified environment. In addition, the internal space of the chamber 5a may become the dehumidified environment by evacuating the internal space of the chamber 5a using the exhaust device 5c. For example, the internal space of the chamber 5a may be adjusted to a vacuum dehumidification environment with a reachable degree of vacuum of about 10 mTorr. The dehumidified environment means that the humidity in the space is 10% or less. The dehumidified environment in the chamber 5a may be realized by disposing a dehumidifying agent, such as silica gel, in the chamber 5a.

A series of operations when the processing on the workpiece W is performed in the processing system 1 will be illustrated as follows. The transport device TU1 of the loader module LM takes out the workpiece W from any of the containers 4a to 4d and transports the workpiece W to the aligner AN. Subsequently, the transport device TU1 takes out the position adjusted workpiece W from the aligner AN, and transports the workpiece W to one of the load lock module LL1 and the load lock module LL2. Next, one load lock module reduces the pressure in the preliminary decompression chamber to a predetermined pressure. Next, the transport device TU2 of the transfer module TF takes out the workpiece W from one of the load lock modules and transports the workpiece W to any of the process modules PM1 to PM6. Then, one or more process modules among the process modules PM1 to PM6 perform processing on the workpiece W. Then, the transport device TU2 transports the processed workpiece W from the process module to one of the load lock module LL1 and the load lock module LL2.

Next, the transport device TU1 transports the workpiece W from one of the load lock modules to any of the containers 4a to 4d.

This processing system 1 includes the controller MC as described above. The controller MC can be a computer including a processor, a storage device such as a memory, a display device, an input/output device, a communication device, and the like. The series of operations of the processing system 1 described above are realized by controlling each part of the processing system 1 by the controller MC according to the program stored in the storage device.

Figure 3:
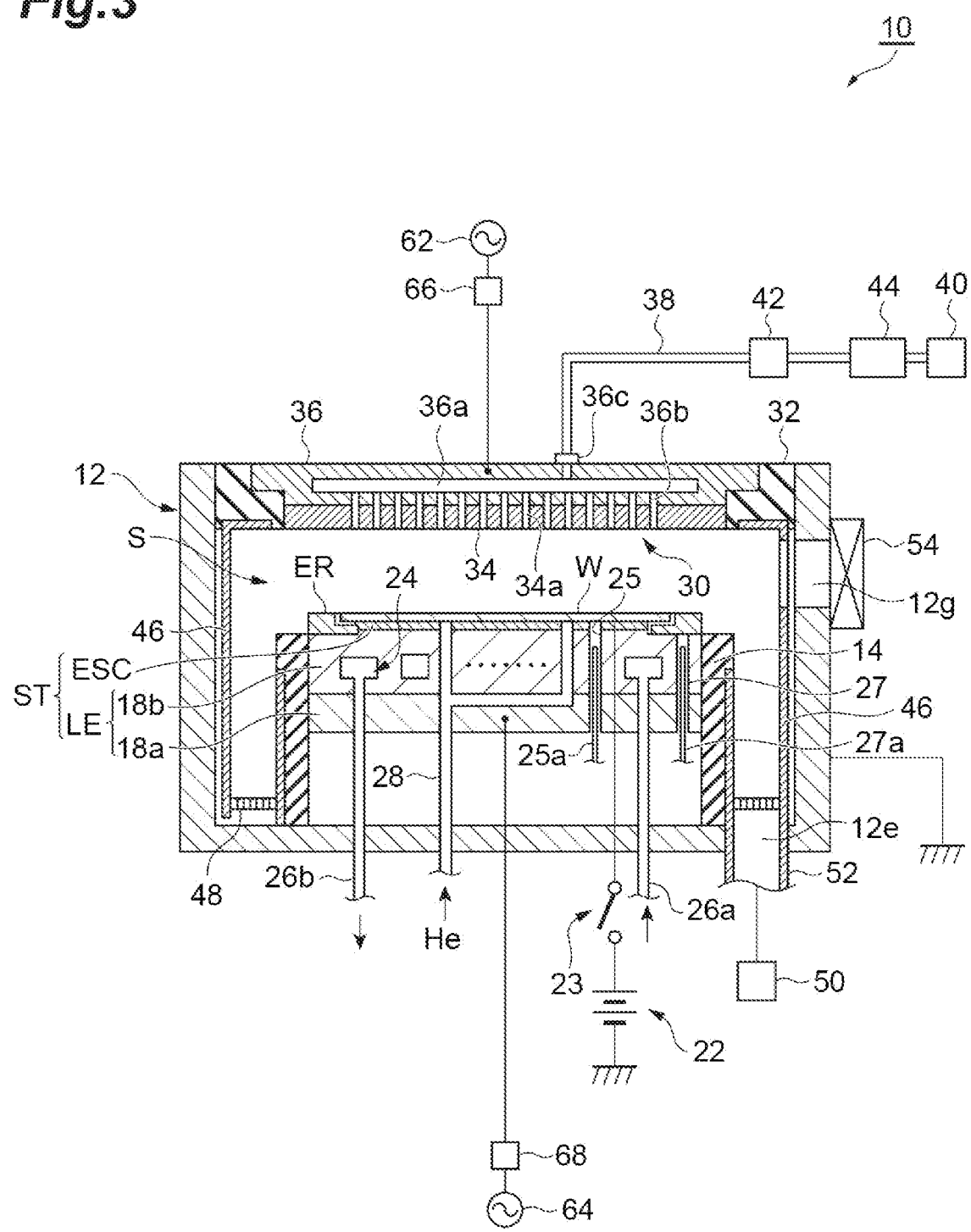
FIG. 3 is a diagram illustrating an example of a plasma processing device.

FIG. 3 is a diagram illustrating an example of a plasma processing device that can be adopted as any of the process modules PM1 to PM6. A plasma processing device 10 illustrated in FIG. 3 is an electrostatic capacitance-coupling type plasma etching device. The plasma processing device 10 includes a chamber body 12 having a substantially cylindrical shape. The chamber body 12 is formed of, for example, aluminum, and the inner wall surface thereof may be anodized. This chamber body 12 is grounded for security.

A support portion 14 having a substantially cylindrical shape is provided on a bottom portion of the chamber body 12. The support portion 14 is formed of, for example, an insulating material. The support portion 14 is provided in the chamber body 12. The support portion 14 extends upward from the bottom portion of the chamber body 12. In addition, a stage ST is provided in a chamber S provided by the chamber body 12. The stage ST is supported by the support portion 14.

The stage ST includes a lower electrode LE and an electrostatic chuck ESC. The lower electrode LE includes a first plate 18a and a second plate 18b. The first plate 18a and the second plate 18b are formed of a metal such as aluminum, and have a substantially disc shape. The second plate 18b is provided on the first plate 18a and is electrically connected to the first plate 18a.

The electrostatic chuck ESC is provided on the second plate 18b. The electrostatic chuck ESC has a structure in which an electrode, which is a conductive film, is disposed between a pair of insulating layers or insulating sheets, and has a substantially disc shape. A DC power supply 22 is electrically connected to the electrode of the electrostatic chuck ESC via a switch 23. This electrostatic chuck ESC adsorbs the workpiece W by an electrostatic force such as a Coulomb force generated by a DC voltage from the DC power supply 22. In this way, the electrostatic chuck ESC can hold the workpiece W.

An edge ring ER is provided on a peripheral edge of the second plate 18b. This edge ring ER is provided to surround the edge of the workpiece W and the electrostatic chuck ESC. The edge ring ER has a first part P1 and a second part P2 (refer to FIG. 7). The first part P1 and the second part P2 have an annular plate shape. The second part P2 is a portion outside the first part P1. The second part P2 has a larger thickness in the height direction than the first part P1. An inner edge P2i of the second part P2 has a diameter larger than a diameter of an inner edge P1i of the first part P1. The workpiece W is mounted on the electrostatic chuck ESC so that the edge region is positioned on the first part P1 of the edge ring ER. The edge ring ER can be formed of any of various materials such as silicon, silicon carbide, and silicon oxide.

A refrigerant flow path 24 is provided inside the second plate 18b. The refrigerant flow path 24 constitutes a temperature control mechanism. Refrigerant is supplied to the refrigerant flow path 24 from a chiller unit provided outside the chamber body 12 via a pipe 26a. The refrigerant supplied to the refrigerant flow path 24 is returned to the chiller unit via the pipe 26b. As described above, the refrigerant is circulated between the refrigerant flow path 24 and the chiller unit. The temperature of the workpiece W supported by the electrostatic chuck ESC is controlled by controlling the temperature of this refrigerant.

A plurality of (for example, three) through holes 25 penetrating the stage ST are formed in the stage ST. The plurality of through holes 25 are formed inside the electrostatic chuck ESC in a plan view. A lift pin 25a is inserted into each of the through holes 25. In FIG. 3, one through hole 25 into which one lift pin 25a is inserted is drawn. The lift pin 25a is provided to be vertically movable in the through hole 25. When the lift pin 25a rises, the workpiece W supported on the electrostatic chuck ESC rises. For example, the lift pin 25a can receive the workpiece W transported by the transport device TU2 based on the transport position data and mount the workpiece W on the electrostatic chuck ESC. Further, the lift pin 25a can deliver the workpiece W mounted on the electrostatic chuck ESC to the transport device TU2.

In the stage ST, a plurality of (for example, three) through holes 27 penetrating the stage ST (lower electrode LE) are formed at a position outside the electrostatic chuck ESC in a plan view. The lift pin 27a is inserted into each of these through holes 27. In FIG. 3, one through hole 27 into which one lift pin 27a is inserted is drawn. The lift pin 27a is provided to be vertically movable in the through hole 27. When the lift pin 27a rises, the edge ring ER supported on the second plate 18b rises. For example, the lift pin 27a can deliver the edge ring ER worn out due to use to the transport device TU2. Also, the lift pin 27a can receive the edge ring ER for replacement, which is transported by the transport device TU2, based on the transport position data, and mount the edge ring ER at the mounting position. The edge ring ER for replacement may be an unused edge ring, or an edge ring that is less consumed.

In addition, a gas supply line 28 is provided in the plasma processing device 10. The gas supply line 28 supplies heat transfer gas from a heat transfer gas supply mechanism, such as He gas, to a place between the upper surface of the electrostatic chuck ESC and the back surface of the workpiece W.

In addition, the plasma processing device 10 includes an upper electrode 30. The upper electrode 30 is disposed above the stage ST to face the stage ST. The upper electrode 30 is supported on the upper portion of the chamber body 12 via an insulating shielding member 32. The upper electrode 30 can include a top plate 34 and a support 36. The top plate 34 faces the chamber S. The top plate 34 is provided with a plurality of gas discharge holes 34a. The top plate 34 can be formed of silicon or quartz. Alternatively, the top plate 34 may be configured by forming a plasma resistant film such as yttrium oxide on the surface of the aluminum base material.

The support 36 detachably supports the top plate 34. The support 36 may be formed of a conductive material such as aluminum. The support 36 can have a water-cooled structure. A gas diffusion chamber 36a is provided inside the support 36. A plurality of gas flow holes 36b communicating with the gas discharge hole 34a extend downward from this gas diffusion chamber 36a. In addition, a gas introduction port 36c for guiding the processing gas into the gas diffusion chamber 36a is formed in the support 36. A gas supply pipe 38 is connected to the gas introduction port 36c.

A gas source group 40 is connected to the gas supply pipe 38 via a valve group 42 and a flow rate controller group 44.

The gas source group 40 includes a plurality of gas sources for a plurality of types of gases. The valve group 42 includes a plurality of valves, and the flow rate controller group 44 includes a plurality of flow rate controllers such as mass flow controllers. The plurality of gas sources of the gas source group 40 are connected to the gas supply pipe 38 via the corresponding valve of the valve group 42 and the corresponding flow rate controller of the flow rate controller group 44, respectively.

In addition, in the plasma processing device 10, a depot shield 46 is detachably provided along the inner wall of the chamber body 12. The depot shield 46 is also provided on the outer periphery of the support portion 14. The depot shield 46 prevents etching by-products (depots) from adhering to the chamber body 12. The depot shield 46 can be configured by covering an aluminum material with ceramics such as yttrium oxide.

An exhaust plate 48 is provided on the bottom portion side of the chamber body 12, and between the support portion 14 and the side wall of the chamber body 12. The exhaust plate 48 can be configured, for example, by covering an aluminum material with ceramics such as yttrium oxide. In the exhaust plate 48, a plurality of holes penetrating in the thickness direction are formed. An exhaust port 12e is provided below the exhaust plate 48 and on the chamber body 12. An exhaust device 50 is connected to the exhaust port 12e via an exhaust pipe 52. The exhaust device 50 includes a vacuum pump such as a pressure regulating valve and a turbo molecular pump. The exhaust device 50 can reduce the pressure of the space in the chamber body 12 to a desired degree of vacuum. In addition, the side wall of the chamber body 12 is provided with a carry-inlet/outlet 12g for the workpiece W. The carry-inlet/outlet 12g can be opened and closed by a gate valve 54.

In addition, the plasma processing device 10 further includes a first radio frequency power supply 62 and a second radio frequency power supply 64. The first radio frequency power supply 62 is a power supply that generates a first radio frequency for the plasma generation. The first radio frequency power supply 62 generates, for example, a radio frequency having a frequency of 27 to 100 MHz. The first radio frequency power supply 62 is connected to the upper electrode 30 via a matcher 66. The matcher 66 includes a circuit for matching an output impedance of the first radio frequency power supply 62 with an input impedance of the load side (upper electrode 30 side). The first radio frequency power supply 62 may be connected to the lower electrode LE via the matcher 66.

The second radio frequency power supply 64 is a power supply that generates a second radio frequency for drawing ions into the workpiece W. The second radio frequency power supply 64 generates, for example, a radio frequency with a frequency in the range of 400 kHz to 13.56 MHz. The second radio frequency power supply 64 is connected to the lower electrode LE via a matcher 68. The matcher 68 includes a circuit for matching an output impedance of the second radio frequency power supply 64 with an input impedance of the load side (lower electrode LE side).

In the plasma processing device 10, gas from one or more gas sources selected from the plurality of gas sources is supplied to the chamber S. In addition, the pressure in the chamber S is set to a predetermined pressure by the exhaust device 50. Further, the gas in the chamber S is excited by the first radio frequency from the first radio frequency power supply 62. As a result, the plasma is generated. Then, the workpiece W is processed by the generated active species. If necessary, ions may be drawn into the workpiece W by a bias based on the second radio frequency from the second radio frequency power supply 64.

Figure 4:
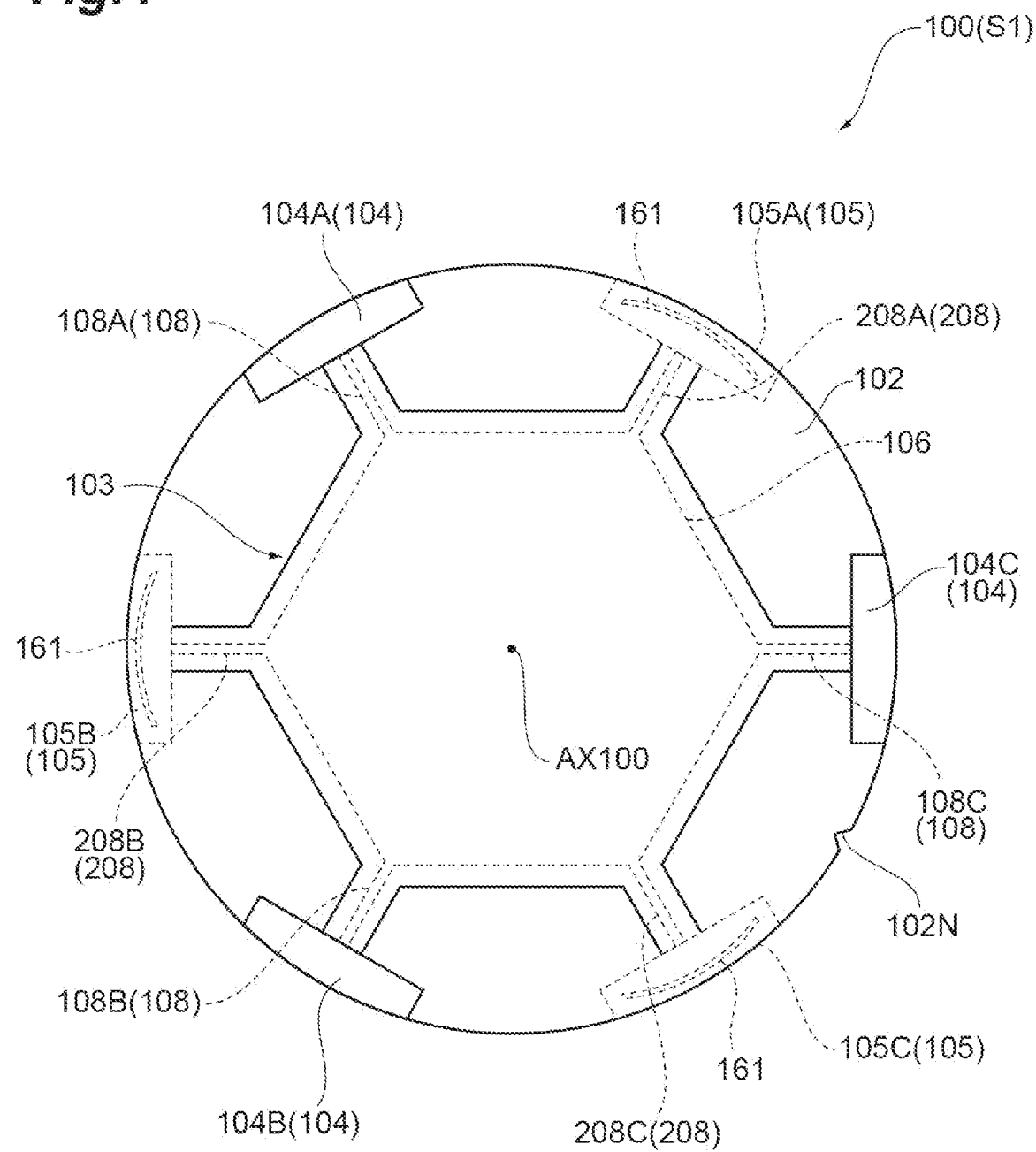
FIG. 4 is a plan view illustrating an example of a measuring device as viewed from a top surface side.
Figure 5:
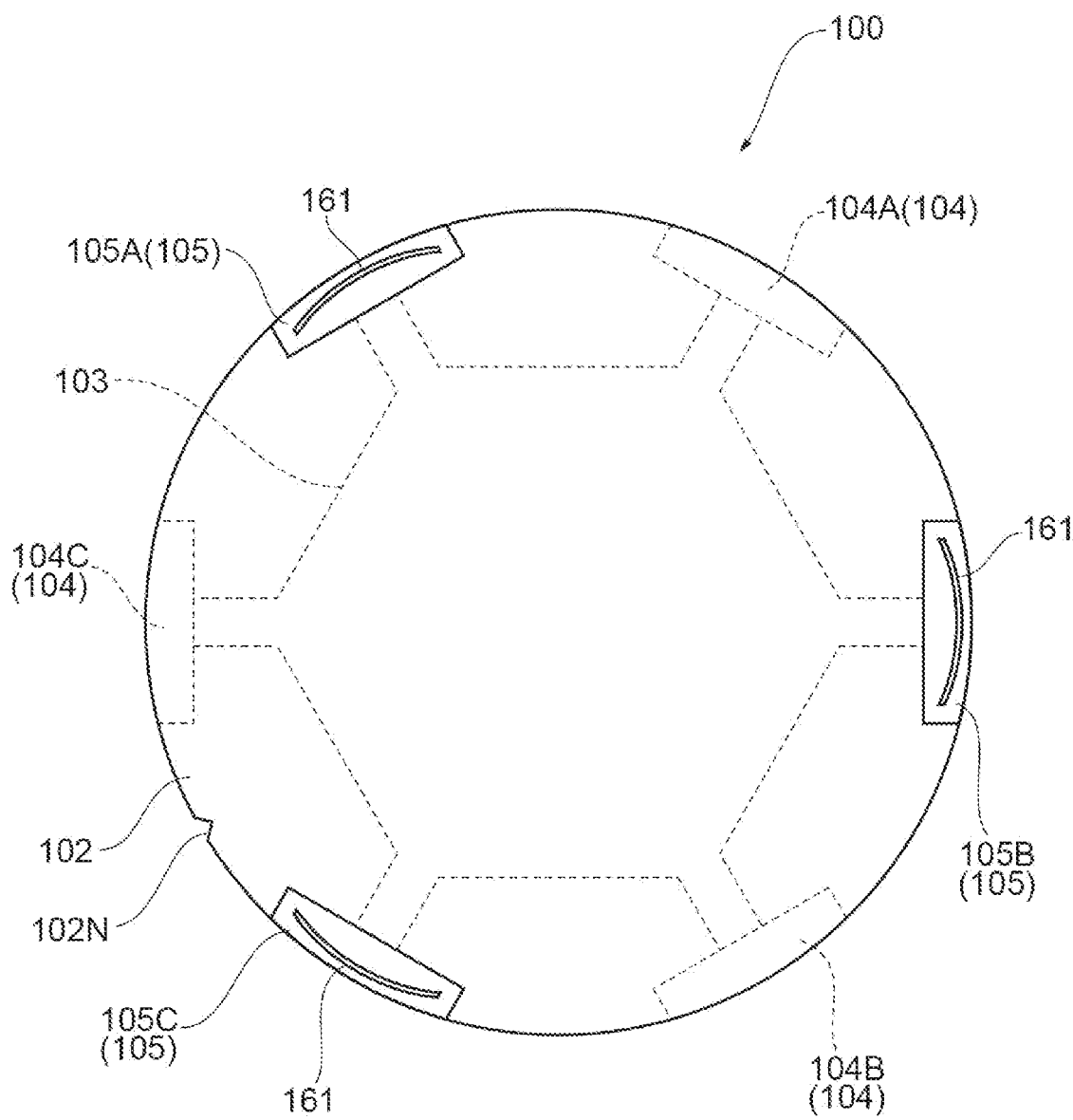
FIG. 5 is a plan view illustrating an example of the measuring device as viewed from a bottom surface side.

The measuring device will be described below. FIG. 4 is a plan view illustrating an example of a measuring device as viewed from a top surface side. FIG. 5 is a plan view illustrating an example of the measuring device as viewed from a bottom surface side. The measuring device 100 illustrated in FIGS. 4 and 5 includes a base board 102. The base board 102 is formed of, for example, silicon, and has a shape similar to a shape of the workpiece W, that is, a substantially disc shape. A diameter of the base board 102 is the same as a diameter of the workpiece W, for example, 300 mm. The shape and dimensions of the measuring device 100 are defined by the shape and dimensions of this base board 102. Therefore, the measuring device 100 has a shape similar to the shape of the workpiece W and has the same dimensions as the workpiece W. In addition, a notch 102N (or another marker) is formed on an edge of the base board 102.

A plurality of first sensors 104A to 104C are provided on the baseboard 102 for measuring electrostatic capacitance. The plurality of first sensors 104A to 104C are arranged at equal intervals along the edge of the base board 102, for example, all around the edge. Specifically, each of the plurality of first sensors 104A to 104C is provided along the edge on the top surface side of the base board 102. The front end surfaces of each of the plurality of first sensors 104A to 104C are along the side surface of the base board 102.

In addition, a plurality of second sensors 105A to 105C for measuring electrostatic capacitance are provided on the base board 102. The plurality of second sensors 105A to 105C are arranged at equal intervals along the edge of the base board 102, for example, all around the edge. Specifically, each of the plurality of second sensors 105A to 105C is provided along the edge on the bottom surface side of the base board. Each sensor electrode 161 of the plurality of second sensors 105A to 105C is along the bottom surface of the base board 102. In addition, the second sensors 105A to 105C and the first sensors 104A to 104C are alternately arranged at intervals of 60° in the circumferential direction.

A circuit board 106 is provided in the center of the upper surface of the base board 102. Wiring groups 108A to 108C are provided between the circuit board 106 and the plurality of first sensors 104A to 104C for electrically connecting each other. In addition, wiring groups 208A to 208C are provided between the circuit board 106 and the plurality of second sensors 105A to 105C for electrically connecting each other. The circuit board 106, the wiring groups 108A to 108C, and the wiring groups 208A to 208C are covered with a cover 103.

Figure 6:
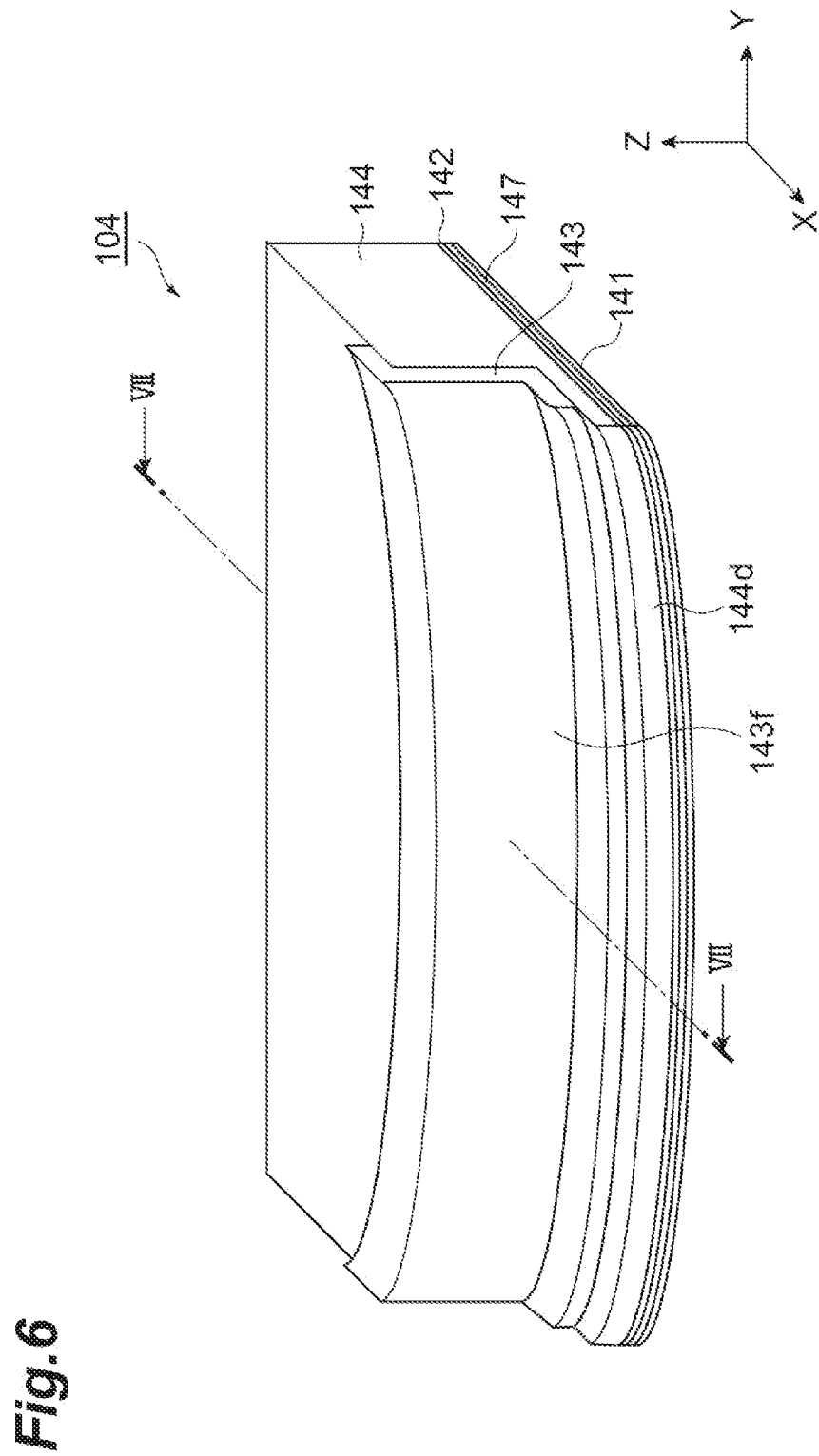
FIG. 6 is a perspective view illustrating an example of a first sensor.
Figure 7:
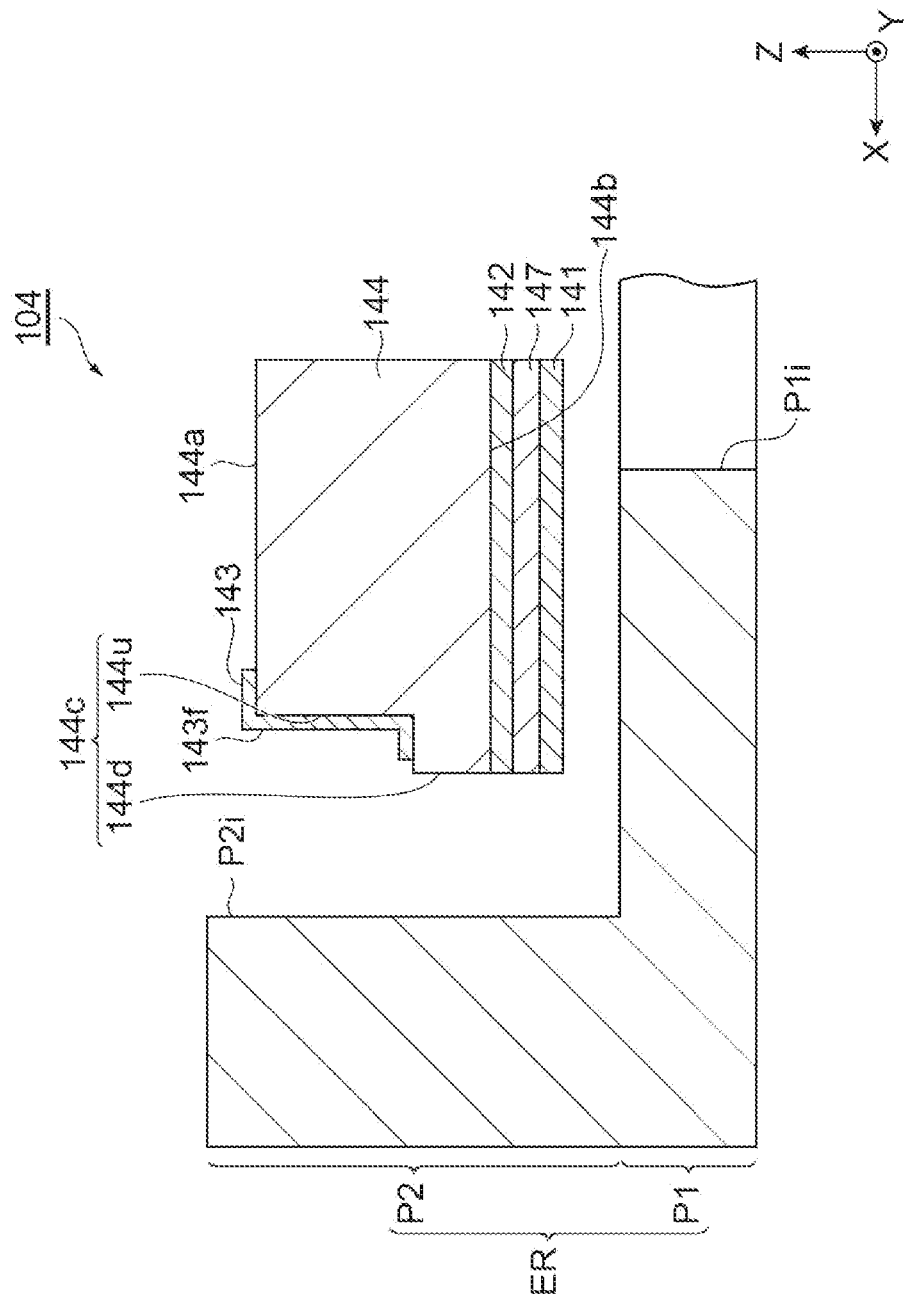
FIG. 7 is a sectional view taken along the line VII-VII in FIG. 6.

Hereinafter, the first sensor will be described in detail. FIG. 6 is a perspective view illustrating an example of the sensor. FIG. 7 is a sectional view taken along the line VII-VII in FIG. 6. The first sensor 104 illustrated in FIG. 6 and FIG. 7 is a sensor used as a plurality of first sensors 104A to 104C of the measuring device 100, and in one example, is configured as a chip-shaped component. In the description below, the XYZ rectangular coordinate system will be referred to as appropriate. The X-direction indicates a front direction of the first sensor 104, the Y-direction indicates a direction orthogonal to the X-direction and indicates the width direction of the first sensor 104, and the Z-direction indicates a direction orthogonal to the X-direction and the Y-direction, and indicates an upward direction of the first sensor 104. FIG. 7 illustrates the edge ring ER together with the first sensor 104.

The first sensor 104 includes an electrode 141, a guard electrode 142, a sensor electrode 143, a board portion 144, and an insulating region 147.

The board portion 144 is formed of, for example, borosilicate glass or quartz. The board portion 144 has a top surface 144a, a bottom surface 144b, and a front end surface 144c. The guard electrode 142 is provided below the bottom surface 144b of the board portion 144 and extends in the X-direction and the Y-direction. In addition, the electrode 141 is provided below the guard electrode 142 via the insulating region 147, and extends in the X-direction and the Y-direction. The insulating region 147 is formed of for example, $SiO_2$, SiN, $Al_2O_3$, or polyimide.

The front end surface 144c of the board portion 144 is formed in a step shape. A lower side surface 144d of the front end surface 144c protrudes toward the edge ring ER side from an upper side surface 144u of the front end surface 144c. The sensor electrode 143 extends along the upper side surface 144u of the front end surface 144c. In an exemplary embodiment, the upper side surface 144u and the lower side surface 144d of the front end surface 144c are curved surfaces having a predetermined curvature, respectively. That is, the upper side surface 144u of the front end surface 144c has a constant curvature at any position of the upper side surface 144u, and the curvature of the upper side surface 144u is a reciprocal number of a distance between the central axis AX100 of the measuring device 100 and the upper side surface and 144u of the front end surface 144c. In addition, the lower side surface 144d of the front end surface 144c has a constant curvature at any position of the lower side surface 144d, and the curvature of the lower side surface 144d is a reciprocal number of a distance between the central axis AX100 of the measuring device 100 and the lower side surface 144d of the front end surface 144c.

The sensor electrode 143 is provided along the upper side surface 144u of the front end surface 144c. In an exemplary embodiment, a front surface 143f of the sensor electrode 143 is also a curved surface. That is, the front surface 143f of the sensor electrode 143 has a constant curvature at any position of the front surface 143f, and the curvature is a reciprocal number of a distance between the central axis AX100 of the measuring device 100 and the front surface 143f.

When the first sensor 104 is used as the sensor of the measuring device 100, as described later, the electrode 141 is connected to a wiring 181, the guard electrode 142 is connected to a wiring 182, and the sensor electrode 143 is connected to a wiring 183.

In the first sensor 104, the sensor electrode 143 is shielded from below of the first sensor 104 by the electrode 141 and the guard electrode 142. Therefore, according to the first sensor 104, it is possible to measure the electrostatic capacitance with high directivity in a specific direction, that is, in the direction (X-direction) in which the front surface 143f of the sensor electrode 143 is facing.

Figure 8:
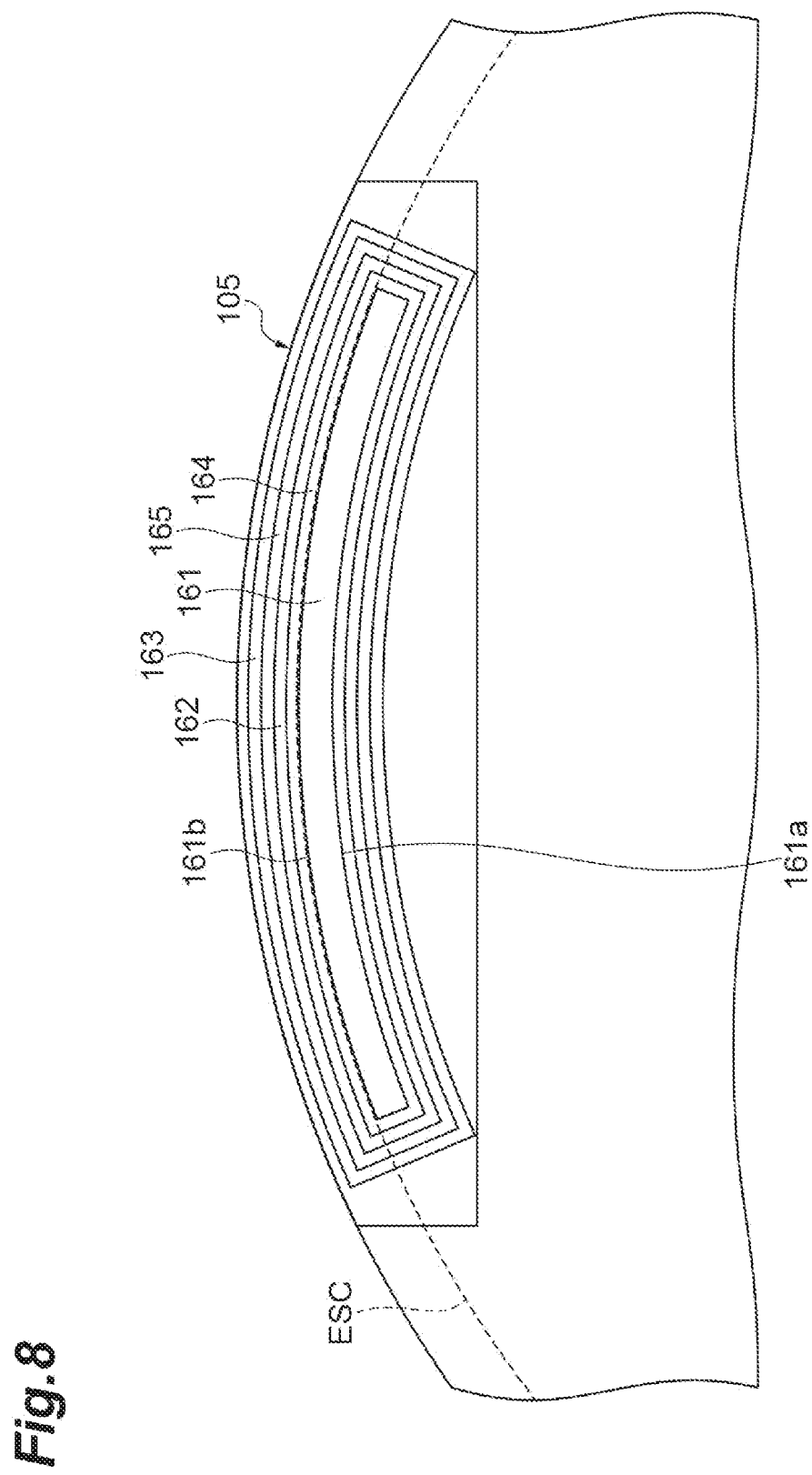
FIG. 8 is an enlarged view of a second sensor in FIG. 5.

Hereinafter, the second sensor will be described in detail. FIG. 8 is a partially enlarged view of FIG. 5, illustrating one second sensor. The second sensor 105 includes a sensor electrode 161. An edge of the sensor electrode 161 has partially an arc shape. That is, the sensor electrode 161 has a planar shape defined by an inner edge 161a and an outer edge 161b, which are two arcs having different radii with the central axis AX100 as a center. The outer edge 161b at the outside in the radial direction of each sensor electrode 161 of the plurality of second sensors 105A to 105C extends on a common circle. In addition, the inner edge 161a at the inner side in the radial direction of each sensor electrode 161 of the plurality of second sensors 105A to 105C extends on another common circle. The curvature of a part of the edge of the sensor electrode 161 coincides with the curvature of the edge of the electrostatic chuck ESC. In an exemplary embodiment, the curvature of the outer edge 161b forming the edge at the outside in the radial direction of the sensor electrode 161 coincides with the curvature of the edge of the electrostatic chuck ESC. The center of curvature of the outer edge 161b, that is, the center of the circle on which the outer edge 161b extends, shares the central axis AX100.

In an exemplary embodiment, the second sensor 105 further includes a guard electrode 162 that surrounds the sensor electrode 161. The guard electrode 162 has a frame shape and surrounds the sensor electrode 161 over the entire circumference. The guard electrode 162 and the sensor electrode 161 are spaced apart from each other so that an insulating region 164 is interposed therebetween. In addition, in an exemplary embodiment, the second sensor 105 further includes an electrode 163 that surrounds the guard electrode 162 at the outside of the guard electrode 162. The electrode 163 has a frame shape and surrounds the guard electrode 162 over the entire circumference. The guard electrode 162 and the electrode 163 are spaced apart from each other so that an insulating region 165 is interposed therebetween.

Figure 9:
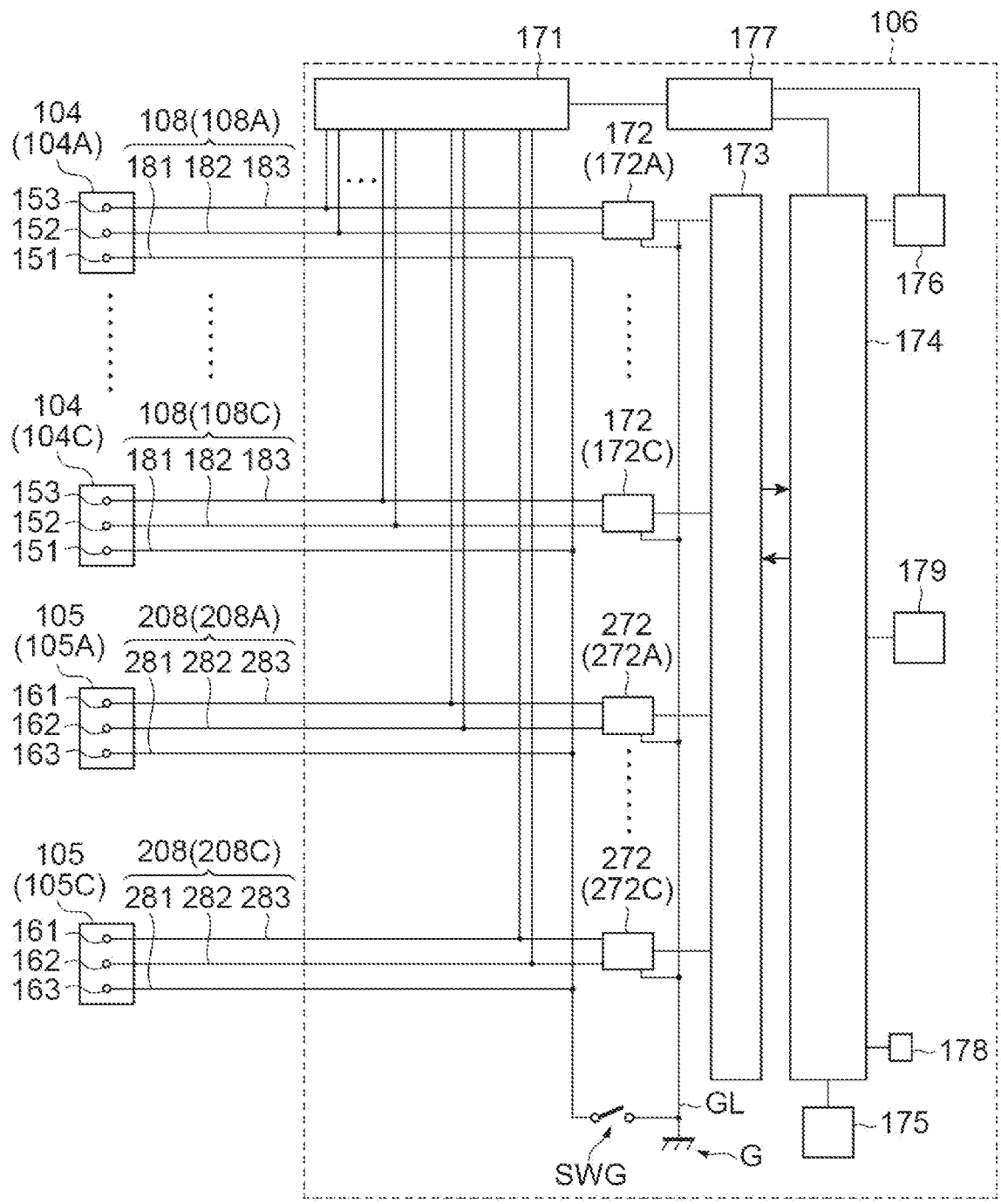
FIG. 9 is a diagram illustrating a configuration of a circuit board of the measuring device.

Hereinafter, the configuration of the circuit board 106 will be described. FIG. 9 is a diagram illustrating a configuration of a circuit board of the measuring device. The circuit board 106 includes a radio frequency oscillator 171, a plurality of C/V conversion circuits 172A to 172C, a plurality of C/V conversion circuits 272A to 272C, an A/D converter 173, a processor 174, a storage device 175, a communication device 176, and a power supply 177. In an example, the arithmetic device is configured with the processor 174, the storage device 175, and the like. In addition, the circuit board 106 includes a temperature sensor 179. The temperature sensor 179 outputs a signal corresponding to the measured temperature to the processor 174. For example, the temperature sensor 179 can acquire the temperature of the environment around the measuring device 100.

Each of the plurality of first sensors 104A to 104C is connected to the circuit board 106 via the corresponding wiring group among the plurality of wiring groups 108A to 108C. In addition, each of the plurality of first sensors 104A to 104C is connected to the corresponding C/V conversion circuit among the plurality of CV conversion circuits 172A to 172C via a couple of wirings included in the corresponding wiring group. Each of the plurality of second sensors 105A to 105C is connected to the circuit board 106 via the corresponding wiring group among the plurality of wiring groups 208A to 208C. In addition, each of the plurality of second sensors 105A to 105C is connected to the corresponding C/V conversion circuit among the plurality of C/V conversion circuits 272A to 272C via a couple of wirings included in the corresponding wiring group. Hereinafter, one first sensor 104 having the same configuration as each of the first sensors 104A to 104C, one wiring group 108 having the same configuration as each of the wiring groups 108A to 108C, and one C/V conversion circuit 172 having the same configuration as each of the C/V conversion circuits 172A to 172C, will be described. In addition, one second sensor 105 having the same configuration as each of the second sensors 105A to 105C, one wiring group 208 having the same configuration as each of the wiring groups 208A to 208C, and the C/V conversion circuit 272 having the same configuration as each of C/V conversion circuits 272A to 272C, will be described.

The wiring group 108 includes wirings 181 to 183. One end of the wiring 181 is connected to the pad 151 that is connected to the electrode 141. The wiring 181 is connected to a ground potential line GL connected to a ground GC of the circuit board 106. The wiring 181 may be connected to the ground potential line GL via a switch SWG. In addition, one end of the wiring 182 is connected to the pad 152 that is connected to the guard electrode 142, and the other end of the wiring 182 is connected to the C/V conversion circuit 172. In addition, one end of the wiring 183 is connected to the pad 153 that is connected to the sensor electrode 143, and the other end of the wiring 183 is connected to the C/V conversion circuit 172.

The wiring group 208 includes wirings 281 to 283. One end of the wiring 281 is connected to the electrode 163. The wiring 281 is connected to a ground potential line GL connected to the ground GC of the circuit board 106. The wiring 281 may be connected to the ground potential line GL via the switch SWG. In addition, one end of the wiring 282 is connected to the guard electrode 162, and the other end of the wiring 282 is connected to the C/V conversion circuit 272. In addition, one end of the wiring 283 is connected to the sensor electrode 161 and the other end of the wiring 283 is connected to the C/V conversion circuit 272.

The radio frequency oscillator 171 is connected to the power supply 177 such as a battery, and is configured to receive power from the power supply 177 to generate a radio frequency signal. The power supply 177 is also connected to the processor 174, the storage device 175, and the communication device 176. The radio frequency oscillator 171 includes a plurality of output lines. The radio frequency oscillator 171 applies the generated radio frequency signal to the wiring 182 and the wiring 183, and to the wiring 282 and the wiring 283 via a plurality of output lines. Therefore, the radio frequency oscillator 171 is electrically connected to the guard electrode 142 and the sensor electrode 143 of the first sensor 104, and the radio frequency signal from the radio frequency oscillator 171 is applied to the guard electrode 142 and the sensor electrode 143. In addition, the radio frequency oscillator 171 is electrically connected to the sensor electrode 161 and the guard electrode 162 of the second sensor 105, and the radio frequency signal from the radio frequency oscillator 171 is applied to the sensor electrode 161 and the guard electrode 162.

The wiring 182 connected to the pad 152 and the wiring 183 connected to the pad 153 are connected to the input of the C/V conversion circuit 172. That is, the guard electrode 142 and the sensor electrode 143 of the first sensor 104 are connected to the input of the C/V conversion circuit 172. In addition, each of the sensor electrode 161 and the guide electrode 162 is connected to the input of the C/V conversion circuit 272. The C/V conversion circuit 172 and the C/V conversion circuit 272 are configured to generate a voltage signal having an amplitude corresponding to the potential difference at the input, and to output the voltage signal. The C/V conversion circuit 172 generates a voltage signal corresponding to the electrostatic capacitance formed by the corresponding first sensor 104. That is, as the electrostatic capacitance of the sensor electrode connected to the C/V conversion circuit 172 increases, the magnitude of the voltage of the voltage signal output from the C/V conversion circuit 172 increases. Similarly, as the electrostatic capacitance of the sensor electrode connected to the C/V conversion circuit 272 increases, the magnitude of the voltage of the voltage signal output from the C/V conversion circuit 272 increases.

The outputs of the C/V conversion circuit 172 and the C/V conversion circuit 272 are connected to the input of the A/D converter 173. In addition, the A/D converter 173 is connected to the processor 174. The A/D converter 173 is controlled by the control signal from the processor 174, converts the output signal (voltage signal) of the C/V conversion circuit 172 and the output signal (voltage signal) of the C/V conversion circuit 272 into digital values, and outputs the results to the processor 174 as detection values.

The storage device 175 is connected to the processor 174. The storage device 175 is a storage device such as a volatile memory, and is configured to store measurement data, for example. In addition, another storage device 178 is connected to the processor 174. The storage device 178 is a storage device such as a non-volatile memory, and stores, for example, a program read and executed by the processor 174.

The communication device 176 is a communication device compliant with any wireless communication standard. For example, the communication device 176 is compliant with Bluetooth®. The communication device 176 is configured to wirelessly transmit the measurement data stored in the storage device 175.

The processor 174 is configured to control each part of the measuring device 100 by executing the program described above. For example, the processor 174 controls the supply of the radio frequency signals from the radio frequency oscillator 171 to the guard electrode 142, the sensor electrode 143, the sensor electrode 161, and the guard electrode 162. In addition, the processor 174 controls the supply of the power from the power supply 177 to the storage device 175, the supply of the power from the power supply 177 to the communication device 176, and the like. Furthermore, the processor 174 acquires the measurement value of the first sensor 104 and the measurement value of the second sensor 105 based on the detection value input from the A/D converter 173 by executing the program described above. In an embodiment, when the detection value output from the A/D converter 173 is X, in the processor 174, the measurement value is acquired based on the detection value such that the measurement value becomes a value proportional to $(a \cdot X + b)$. Here, a and b are constants that change depending on the state of the circuit, and the like. The processor 174 may have, for example, a predetermined arithmetic expression (function) such that the measurement value becomes a value proportional to $(a \cdot X + b)$.

In the measuring device 100 as described above, in a state in which the measuring device 100 is disposed in a region surrounded by the edge ring ER, a plurality of sensor electrodes 143 and the guard electrodes 142 face an inner edge of the edge ring ER. The measurement value generated based on the potential difference between the signal of the sensor electrode 143 and the signal of the guard electrode 142 represents the electrostatic capacitance that reflects the distance between each of the plurality of sensor electrodes 143 and the edge ring ER. The electrostatic capacitance C is represented by $C = \varepsilon S/d$. $\varepsilon$ is permittivity of the medium between the front surface 143f of the sensor electrode 143 and the inner edge of the edge ring ER, S is an area of the front surface 143f of the sensor electrode 143, and d can be regarded as a distance between the front surface 143f of the sensor electrode 143 and the inner edge of the edge ring ER.

Therefore, according to the measuring device 100, measurement data that reflects the relative positional relationship between the measuring device 100 imitating the workpiece W and the edge ring ER can be acquired. For example, the plurality of measurement values acquired by the measuring device 100 become smaller as the distance between the front surface 143*f* of the sensor electrode 143 and the inner edge of the edge ring ER becomes larger. Therefore, an amount of deviation of each sensor electrode 143 in each radial direction of the edge ring ER can be obtained based on the measurement value representing the electrostatic capacitance of each sensor electrode 143 of the first sensors 104A to 104C. Then, an error in the transport position of the measuring device 100 can be obtained from the amount of deviation of each sensor electrode 143 of the first sensors 104A to 104C in each radial direction.

In addition, in a state in which the measuring device 100 is mounted on the electrostatic chuck ESC, a plurality of sensor electrodes 161 and the guard electrodes 162 face the electrostatic chuck ESC. As described above, the electrostatic capacitance C is represented by C=εS/d. ε is the permittivity of the medium between the sensor electrode 161 and the electrostatic chuck ESC. d is a distance between the sensor electrode 161 and the electrostatic chuck ESC. S can be regarded as an area where the sensor electrode 161 and the electrostatic chuck ESC overlap each other in a plan view. The area S changes depending on a relative positional relationship between the measuring device 100 and the electrostatic chuck ESC. Therefore, according to the measuring device 100, the measurement data that reflects the relative positional relationship between the measuring device 100 imitating the workpiece W and the electrostatic chuck ESC can be acquired.

In one example, when the measuring device 100 is transported to a predetermined transport position, that is, a position on the electrostatic chuck ESC where the center of the electrostatic chuck ESC coincides with the center of the measuring device 100, the outer edge 161*b* of the sensor electrode 161 and the edge of the electrostatic chuck ESC may coincide with each other. In this case, for example, since the transport position of the measuring device 100 deviates from the predetermined transport position, when the sensor electrode 161 deviates outward in the radial direction with respect to the electrostatic chuck ESC, the area S decreases. That is, the electrostatic capacitance measured by the sensor electrode 161 becomes smaller than the electrostatic capacitance when the measuring device 100 is transported to the predetermined transport position. Therefore, the amount of deviation of each sensor electrode 161 of the electrostatic chuck ESC in each radial direction can be obtained based on the measurement value representing the electrostatic capacitance of each sensor electrode 161 of the second sensors 105A to 105C. Then, an error in the transport position of the measuring device 100 can be obtained from the amount of deviation of each sensor electrode 161 of the second sensors 105A to 105C in each radial direction.

Figure 10:
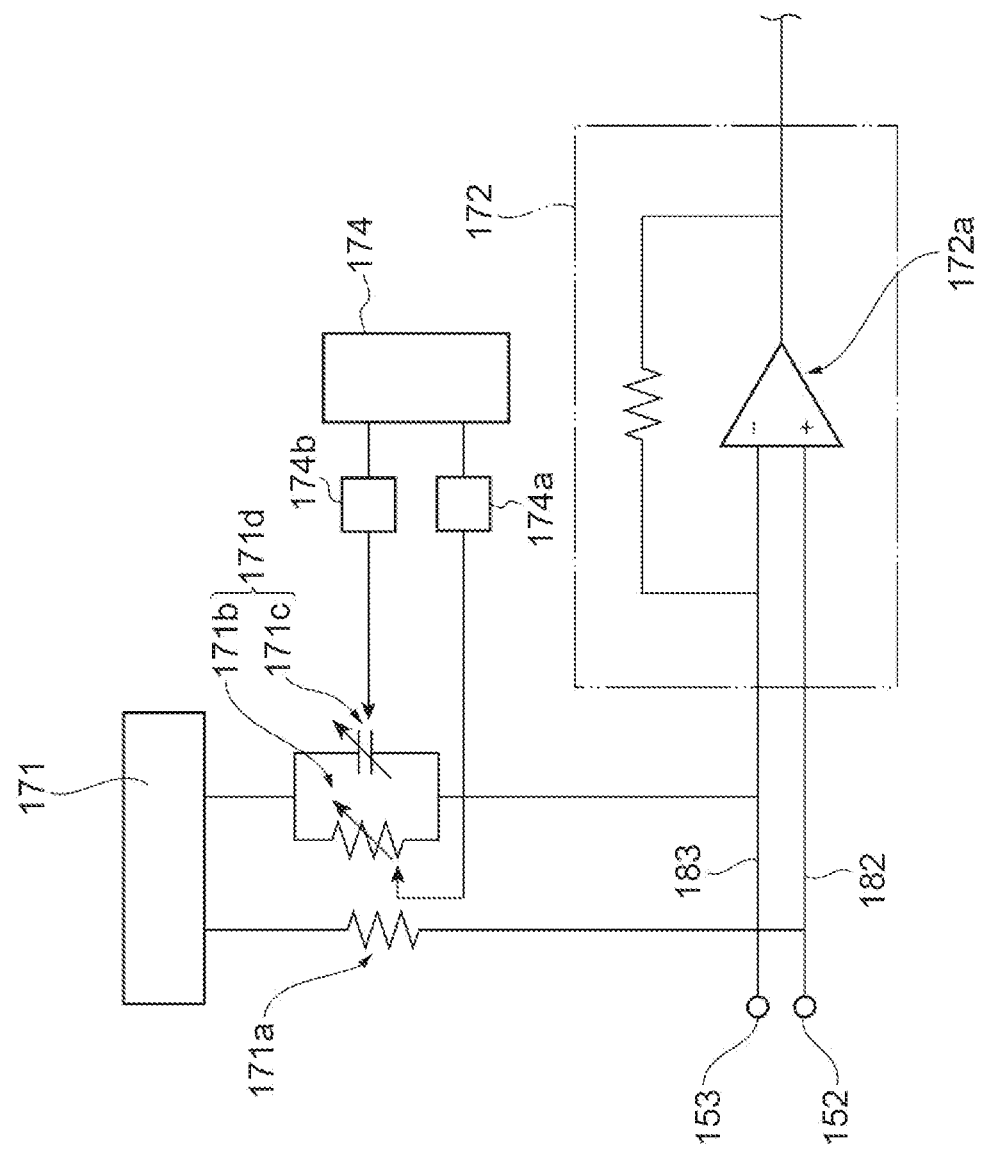
FIG. 10 is a diagram illustrating a detailed configuration of the circuit board of the measuring device.

Next, a configuration for suppressing variations in the measurement value of the electrostatic capacitance caused by a change in a temperature environment will be described. First, connections between the radio frequency oscillator 171 and the wiring 182 and between the wiring 183 and the C/V conversion circuit 172 will be described in more detail. FIG. 10 is a circuit diagram illustrating connections between the radio frequency oscillator 171 and the wiring 182 and between the wiring 183 and the C/V conversion circuit 172. As illustrated in FIG. 10, a resistor 171*a* is connected between the radio frequency oscillator 171 and the wiring 182. A phase adjustment circuit 171*d* including a variable resistor 171*b* and a variable capacitor 171*c* is connected between the radio frequency oscillator 171 and the wiring 183. The C/V conversion circuit 172 has an amplifier circuit 172*a* including an operational amplifier and a resistor as part thereof. In the amplifier circuit 172*a*, the wiring 183 is connected to an inversion input terminal of the operational amplifier, and the wiring 182 is connected to a non-inversion input terminal of the operational amplifier. In addition, the inversion input terminal and the output terminal of the operational amplifier are connected via the resistor. The amplifier circuit 172*a* amplifies a potential difference between the signal from the sensor electrode 143 input to the C/V conversion circuit 172 and the signal from the guard electrode 142.

The radio frequency oscillator 171 and the wiring 282 and the wiring 283 and the C/V conversion circuit 272 are connected in the same manner as the radio frequency oscillator 171 and the wiring 182 and the wiring 183 and the C/V conversion circuit 172, respectively. That is, a resistor is connected between the radio frequency oscillator 171 and the wiring 282. A phase adjustment circuit including a variable resistor and a variable capacitor is connected between the radio frequency oscillator 171 and the wiring 283. The C/V conversion circuit 272 has an amplifier circuit including an operational amplifier and a resistor as part thereof. In the amplifier circuit, the wiring 283 is connected to the inversion input terminal of the operational amplifier, and the wiring 282 is connected to the non-inversion input terminal of the operational amplifier. In addition, the inversion input terminal and the output terminal of the operational amplifier are connected via the resistor.

In the circuit configuration as described above, the amplitude of the signal from the sensor electrode 143 can be changed by changing a resistance value of the variable resistor 171*b* of the phase adjustment circuit 171*d*. In addition, the phase of the signal from the sensor electrode 143 can be changed by changing electrostatic capacitance value of the variable capacitor 171*c* of the phase adjustment circuit 171*d*. In one exemplary embodiment, the processor 174 adjusts (controls) the resistance value of variable resistor 171*b* and the electrostatic capacitance value of the variable capacitor 171*c* to adjust an admittance of the phase adjustment circuit 171*d*.

In FIG. 10, an output of a D/A converter 174*a* connected to the processor 174 is input to the variable resistor 171*b*. The processor 174 outputs a parameter for adjusting a resistance value of the variable resistor 171*b* as a digital signal to the D/A converter 174*a*. The D/A converter 174*a* converts the input digital signal into an analog signal and outputs the analog signal to the variable resistor 171*b*. Therefore, the resistance value of the variable resistor 171*b* is controlled to a resistance value corresponding to the digital signal that is output from the processor 174.

Further, the output of the D/A converter 174*b* connected to the processor 174 is input to the variable capacitor 171*c*. The processor 174 outputs a parameter for adjusting a electrostatic capacitance value of the variable capacitor 171*c* as a digital signal to the D/A converter 174*b*. The D/A converter 174*b* converts the input digital signal into an analog signal and outputs the analog signal to the variable capacitor 171*c*. Therefore, the electrostatic capacitance value of the variable capacitor 171*c* is controlled to a electrostatic capacitance value corresponding to the digital signal that is output from the processor 174.

In one exemplary embodiment, the processor 174 acquires a correction parameter group according to a measurement environment based on a reference parameter group (second parameter group) as a reference for adjusting the resistance value of the variable resistor 171*b* and the electrostatic capacitance value of the variable capacitor 171*c*. The reference parameter group has a plurality of reference parameters acquired in advance in the dehumidified environment. For example, the reference parameter group may be acquired during a manufacturing stage of the measuring device 100.

The reference parameter group for adjusting the resistance value of the variable resistor 171*b* and the reference parameter group for adjusting the electrostatic capacitance value of the variable capacitor 171*c* may be stored in the storage device 178 as a table, for example. The table has reference parameters corresponding to each of a plurality of temperatures. The reference parameter group is used for reference point adjustment of the output voltage signals of the plurality of C/V conversion circuits 172 and 272 at each of the plurality of temperatures. For example, the reference point adjustment may be a zero point adjustment. That is, the reference parameters may be parameters for adjusting the resistance value of the variable resistor 171*b* and the electrostatic capacitance value of the variable capacitor 171*c* such that the voltage signals output from the C/V conversion circuits 172 and 272 become zero, in a state where there is no object to be detected by the measuring device 100. The parameters may be parameters corresponding to the digital signals output from the processor 174 to the D/A converters 174*a* and 174*b* in order to control each of the electrostatic capacitance value of the variable capacitor 171*c* and the resistance value of the variable resistor 171*b*.

For example, the storage device 178 has a table whose elements are reference parameters to control the variable resistor 171*b* in each of the first sensors 104A to 104C. The storage device 178 has a table whose elements are reference parameters to control the variable resistor 171*b* in each of the second sensors 105A to 105C. Each table for controlling the variable resistor 171*b* has reference parameters corresponding to each sensor for each of the plurality of temperatures.

The storage device 178 has a table whose elements are reference parameters for controlling the variable capacitor 171*c* in each of the first sensors 104A to 104C. The storage device 178 has a table whose elements are reference parameters for controlling the variable capacitor 171*c* in each of the second sensors 105A to 105C. Each table for controlling the variable capacitor 171*c* has reference parameters corresponding to each sensor for each of the plurality of temperatures.

The reference parameter group may be acquired under an environment when the measuring device 100 is actually used. That is, an example of the reference parameter group may be acquired under a temperature environment of 20° C. to 80° C. and under a dehumidified environment where a reachable degree of vacuum is about 10 mTorr and humidity is 10% or less. In one exemplary embodiment, the reference parameter group is acquired by the measuring device 100 under a dehumidified environment for one day or longer.

In the acquiring of the reference parameter group, the variable resistor 171*b* and the variable capacitor 171*c* are adjusted under the above environment such that the voltage signals output from the C/V conversion circuits 172 and 272 become zero, in a state where the there is no object to be detected by the measuring device 100. The state where there is no object to be detected by the measuring device 100 means that a state where a space, in which the detection value between the measuring device 100 and the object to be detected has to be zero, is formed. Then, the resistance value of the variable resistor 171*b* and the electrostatic capacitance value of the variable capacitor 171*c* when adjusted in this way are acquired as target reference parameters. A table can be created by acquiring the reference parameters at each temperature in a state where the temperature of the measuring device 100 is adjusted between 20° C. to 80° C. The reference parameters may be acquired at a predetermined temperature increment within the range of 20° C. to 80° C. For example, the reference parameters may be acquired at an increment of about 3° C. In this case, a temperature zone for which reference parameters have not been acquired may be estimated based on the acquired reference parameters. For example, by performing linear interpolation between the acquired reference parameters, the reference parameter of the temperature zone for which the reference parameters have not been acquired may be determined.

As described above, the reference parameter group is acquired at the manufacturing stage of the measuring device 100 and may not be used as it is in the actual usage environment. For example, even if the measuring device 100 is in the dehumidified environment before use, a state of the measuring device 100 when the reference parameter group has been acquired cannot be reproduced, and even if the reference parameter group is used, the zero point adjustment may not be possible. Therefore, in the measuring device 100 according to one exemplary embodiment, a correction parameter group suitable for the usage environment is acquired based on the reference parameter group.

An exemplary processor 174 acquires a parameter (first parameter) for reference point adjustment under the environment before use at an arbitrary temperature, and acquires a parameter at each temperature under the environment before use based on the acquired parameter and the reference parameter. That is, the exemplary processor 174 acquires parameters for adjusting the resistance value of the variable resistor 171*b* and the electrostatic capacitance value of the variable capacitor 171*c* such that the voltage signals of the C/V conversion circuits 172 and 272 become zero, in a state where there is no object to be detected by the measuring device 100. The processor 174 acquires temperature data indicating a temperature when the parameter is acquired (first time) as a correction temperature and holds the temperature data together with the parameter. The processor 174 corrects the reference parameters such that the parameters acquired at the correction temperature match the reference parameters. For example, the processor 174 acquires the reference parameter corresponding to the correction temperature based on the reference parameter group, and acquires a difference between the reference parameter and a parameter (first parameter) acquired at the correction temperature. For example, when the reference parameter corresponding to the correction parameter is not stored in the table, the reference parameter corresponding to the correction temperature may be acquired from data obtained by linearly interpolating the reference parameter group that is acquired in advance. The processor 174 acquires a correction parameter group by developing the acquired difference to all the reference parameters of the reference parameter group.

FIG. 11 is an example of a table storing the reference parameter group. FIG. 12 is an example of a table storing the correction parameter group. FIGS. 11 and 12 illustrate parameters of the resistance value and electrostatic capacitance value at each temperature when the reference points are adjusted at the plurality of temperatures. It is assumed that when the measuring device 100 has the reference parameter group illustrated in FIG. 11, a parameter (first parameter) for reference point adjustment is newly acquired under a temperature environment of 23.8° C. For example, it is assumed that the newly acquired parameter of the resistance value for reference point adjustment is "11097" and the parameter of the electrostatic capacitance value is "38892". In this case, the processor 174 acquires a value "11068" as the reference parameter for the resistance value at 23.8° C. and acquires a value "38873" as the reference parameter for the electrostatic capacitance value by performing linear interpolation between the reference parameters constituting the reference parameter group. The processor 174 acquires differences between "11097" and "38892", which are parameters acquired for the reference point adjustment, and between "11068" and "38873", which are the reference parameters, respectively. The processor 174 develops the acquired differences into all the reference parameters of the reference parameter group. That is, in the case of the above example, the processor 174 adds the differences "29" and "19" to the reference parameter of the resistance value and the reference parameter of the electrostatic capacitance value, respectively, thereby acquiring a correction parameter group illustrated in FIG. 12.

The processor 174 uses the acquired correction parameter group to adjust the resistance value of the variable resistor 171b and the electrostatic capacitance value of the variable capacitor 171c to adapt to the fluctuating temperatures. That is, the processor 174 acquires a correction parameter corresponding to the temperature acquired by the temperature sensor 179 at a second time after the first time based on the correction parameter group. Then, the processor 174 adjusts the resistance value of the variable resistor 171b and the electrostatic capacitance value of the variable capacitor 171c based on the acquired correction parameter. When the correction parameter corresponding to the acquired temperature is not stored, the corresponding correction parameter may be acquired by performing linear interpolation between the respective correction parameters.

Further, as described above, when the detection value output from the A/D converter 173 is X, the processor 174 acquires the measurement value such that the measurement value is proportional to (a·X+b). a and b are constants that change depending on the circuit state, etc., and may depend on the ambient temperature. In one embodiment, the constants a and b are adjusted corresponding to the C/V conversion circuits 172A to 172C and the C/V conversion circuits 272A to 272C, respectively, so that each of the detection value X output from the A/D converter 173 is converted to the measurement value representing the electrostatic capacitance based on the calculation value. The electrostatic capacitance based on the calculation value can be calculated by an expression for obtaining the electrostatic capacitance C.

In one exemplary embodiment, the processor 174 adjusts the constants a and b. The constants a and b may be stored in the storage device 178 as a table, for example. The table has constants a and b associated with the plurality of temperatures as elements. For example, the storage device 178 has a table corresponding to each of the C/V conversion circuits 172A to 172C and the C/V conversion circuits 272A to 272C. That is, the storage device 178 stores a plurality of constant groups associated with the plurality of temperatures, respectively, in order to suppress temperature dependence of a plurality of measurement values output from the A/D converter 173. Each constant group has a plurality of constants a and b corresponding to the C/V conversion circuits 172A to 172C and the C/V conversion circuits 272A to 272C, respectively. The processor 174 selects the constant group corresponding to the ambient temperature, and uses the plurality of constants a and b constituting the selected constant group as constants of functions corresponding thereto.

An example of a method for acquiring such a table will be described. The usage environment of the measuring device 100 may be a dehumidified vacuum environment with a temperature of 20° C. to 80° C. and a reachable degree of vacuum of about 10 mTorr.

The constants a and b are acquired under the environment when the measuring device 100 is actually used. That is, in one example, the constants a and b are acquired under a temperature environment of 20° C. to 80° C. and a dehumidified vacuum environment with a reachable degree of vacuum of about 10 mTorr. In the acquiring of the constants a and b, first, the measuring device 100 is disposed inside the edge ring ER and on the electrostatic chuck ESC. Then, in this state, while horizontally changing the position of the measuring device 100, the relative position of the measuring device 100 and the detection value X at the position are acquired. The relative position of the measuring device 100 may be a distance of each of the first sensors 104A to 104C with respect to the edge ring ER. In this case, the electrostatic capacitance of each of the first sensors 104A to 104C can be calculated based on the calculation value. In addition, the relative position of the measuring device 100 may be a position of each of the second sensor 105A to 105C with respect to the electrostatic chuck ESC. In this case, an overlapping area of the sensor electrode 161 and the electrostatic chuck ESC in plan view can be calculated. That is, the electrostatic capacitance of each of the second sensors 105A to 105C can be calculated from the calculation values. Then, the constants a and b are calculated such that the acquired detection value X is approximated to the electrostatic capacitance based on the calculation value. The calculated constants a and b are acquired as elements constituting the table. The table can be created by acquiring the constants a and b at each temperature in a state where the temperature of the measuring device 100 is adjusted between 20° C. to 80° C.

Figure 13:
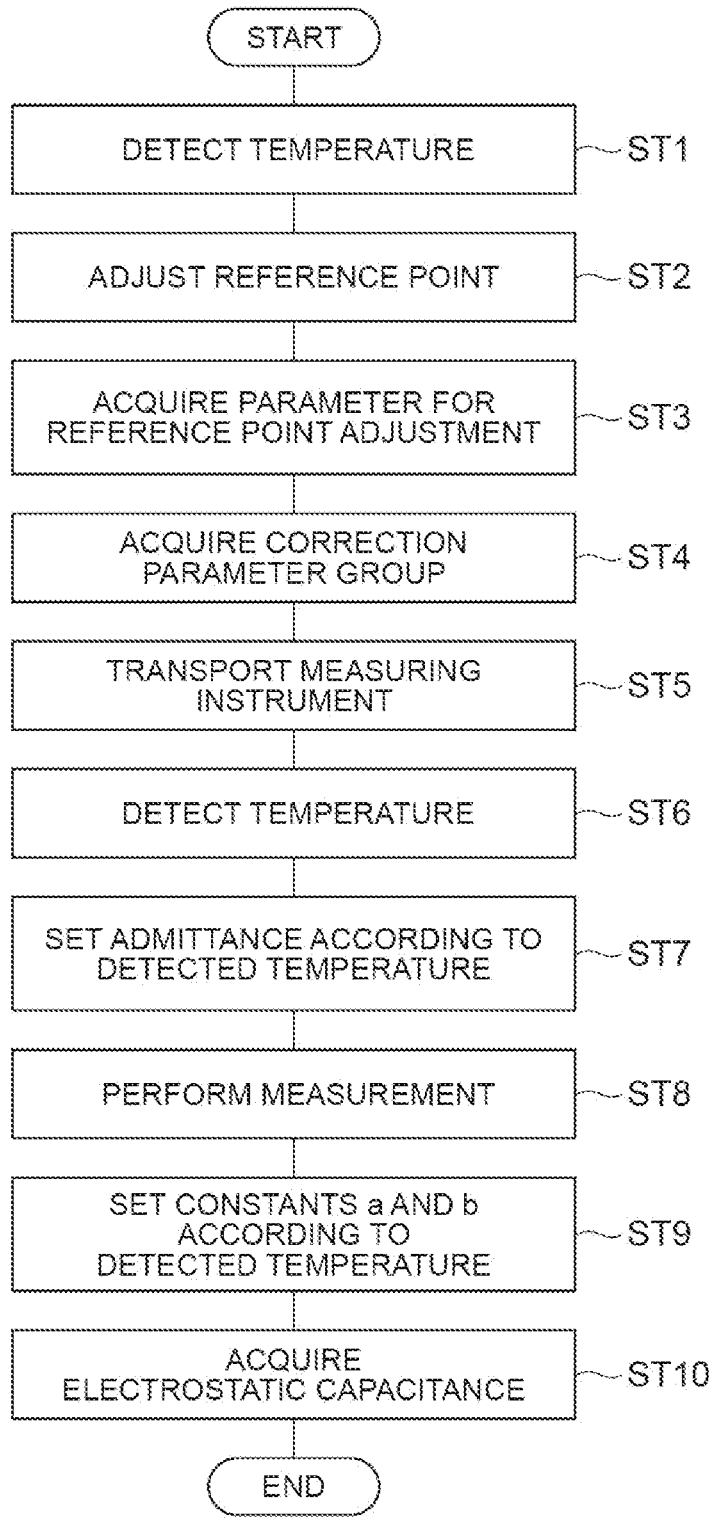
FIG. 13 is a flow chart showing an example of a procedure when the measuring device measures electrostatic capacitance.

Next, an example of an operation of measuring device 100 will be described. FIG. 13 is a flowchart showing an operation of the measuring device 100 from a reference point adjustment step to a step of measuring the electrostatic capacitance. The operation in the flowchart is an operation of a measuring system in which the measurement value representing the electrostatic capacitance is acquired by the measuring device 100 in the chamber S of the processing system 1. This operation is controlled by one or more control devices (in one example, processor 174 of the measuring device 100 and controller MC of processing system 1). As a premise, the measuring device 100 is assembled in a factory or the like to perform adjustment for calibration. The adjustment for calibration may be acquisition of a table whose elements are the constants a and b described above. Thereafter, the reference parameter group is acquired by the measuring device 100 that has been under the dehumidified environment for one day or longer.

In an operation flow illustrated in FIG. 13, the measuring device 100 is kept in the chamber 5a of the keeping device 5. In one example, the inside of the chamber 5a is in the dehumidified environment in a state where the measuring device 100 is mounted in the chamber 5a of the keeping device 5. In this case, the inside of the chamber 5a may be under the dehumidified environment such as a dehumidified purge gas atmosphere or a vacuum environment. First, the measuring device 100 detects an ambient temperature using the temperature sensor 179 (step ST1). The detected temperature data is stored in the storage device 175, for example. Next, reference point adjustment of the output voltage signals of the C/V conversion circuits 172 and 272 is performed (step ST2). As described above, the reference point adjustment may be zero point adjustment. That is, in a state where there is no object to be detected by the measuring device 100, the processor 174 adjusts the resistance value of the variable resistor 171b and the electrostatic capacitance value of the variable capacitor 171c such that the voltage signals output from the C/V conversion circuits 172 and 272 become zero. The order of step ST1 and step ST2 may be reversed, or may be performed simultaneously.

The processor 174 stores digital values output to the D/A converters 174a and 174b in the storage device 175, in order to adjust the resistance value of the variable resistor 171b and the electrostatic capacitance value of the variable capacitor 171c, for example. That is, the processor 174 acquires parameters for reference point adjustment under the current environment (step ST3). In one example, in a state where the measuring device 100 is kept in the chamber 5a of the keeping device 5, there is no object to be detected by the measuring device 100. Therefore, each of the above steps can be executed within the keeping device 5. Each of the above steps may be executed by the measuring device 100 that is taken out from the keeping device 5.

Subsequently, measuring device 100 acquires a correction parameter group (step ST4). That is, the processor 174 acquires the reference parameters corresponding to the temperature data acquired in step ST1 based on the pre-stored reference parameter group. Then, the processor 174 acquires a correction parameter group by correcting the reference parameter group to correspond to the parameter acquired in step ST3, based on the acquired reference parameter and the parameter acquired in step ST3. The acquired correction parameter group is stored in the storage device 175, for example.

Subsequently, the measuring device 100 is transported by the transport device TU2 to a position on a mounting region specified by the transport position data (step ST5). In one example, the measuring device 100 may be kept in the dehumidified environment that is created by the keeping device 5 immediately before the transportation. In step ST5, the transport device TU1 transports the measuring device 100 from the keeping device 5 to one of the load lock module LL1 and the load lock module LL2. Then, the transport device TU2 transports the measuring device 100 from one of the load lock modules to one of the process modules PM1 to PM6 based on the transport position data, and mounts the measuring device 100 in the mounting region of the electrostatic chuck ESC. The mounting region may be surrounded by the edge ring ER. The transport position data is coordinate data predetermined so that the position of the central axis AX100 of the measuring device 100 coincides with the center position of the edge ring ER. The transport position data may be coordinate data predetermined so that the position of the central axis AX100 of the measuring device 100 coincides with the center position of the electrostatic chuck ESC. The inside of the process module in which the measuring device 100 is transported may be adjusted to a vacuum dehumidified environment with reachable degree of vacuum of about 10 mTorr.

While the measuring device 100 is transported from the keeping device 5 to the process module, the measuring device 100 may be temporarily exposed to the air. A time when the measuring device 100 is exposed to the air is set to a length of a degree that the humidity in the air does not substantially affect the measuring device 100. For example, the time when the measuring device 100 is exposed to the air may be one hour or shorter.

Subsequently, the ambient temperature is detected by the temperature sensor 179 (step ST6). The detected temperature data is stored in the storage device 175, for example. Then, according to the detected temperature data, the resistance value of the variable resistor 171b and the electrostatic capacitance value of the variable capacitor 171c are set in the phase adjustment circuit 171d (step ST7). That is, the processor 174 acquires temperature data detected by temperature sensor 179 from storage device 175. Then, the processor 174 acquires a correction parameter corresponding to the temperature data from among correction parameter groups stored in the storage device 175. The processor 174 outputs the acquired correction parameter as a digital signal to the D/A converter 174a, thereby controlling the resistance value of the variable resistor 171b and the electrostatic capacitance value of the variable capacitor 171c.

Subsequently, measurement is performed by the measuring device 100 (step ST8). In step ST8, the output signal (voltage signal) of the C/V conversion circuit 172 and the output signal (voltage signal) of the C/V conversion circuit 272 are converted into digital values by the A/D converter, and the digital values are output to the processor 174 as detection values. The detection values may be associated with the temperature data and stored in the storage device 175, for example.

Subsequently, a constant of a function for calculating a measurement value representing the electrostatic capacitance from the detection value X output from the A/D converter 173, is set (step ST8). In one exemplary embodiment, the function is set such that the measurement value is proportional to (a·X+b). The processor 174 acquires the constants a and b corresponding to the temperature data associated with the detection values from the table including the plurality of constants a and b stored in the storage device 178. Thereby, the constants a and b are set (step ST9).

Subsequently, the electrostatic capacitance is acquired (step ST10). That is, the detection value is converted into a measurement value representing the electrostatic capacitance by a function reflecting the acquired constants a and b. The acquired electrostatic capacitance data may be stored in the storage device 175 in a state where the acquired electrostatic capacitance data is associated with temperature data, detection value, and the like for each sensor. In one exemplary embodiment, the amount of deviation of the center of the measuring device 100 with respect to the center position of the edge ring ER (first amount of deviation) may be derived based on the respective electrostatic capacitances acquired by the first sensors 104A to 104C. In addition, the amount of deviation (second amount of deviation) of the center of the measuring device 100 with respect to the center position of the electrostatic chuck ESC may be derived based on the respective electrostatic capacitances acquired by the second sensors 105A to 105C. Furthermore, the amount of deviation (third amount of deviation) of the center of the edge ring ER with respect to the center position of the electrostatic chuck ESC may be derived based on the first amount of deviation and the second amount of deviation. Such an amount of deviation may be used, for example, for calibrating the transport position data used for transport by the transport device TU2.

As an example, the controller MC may calibrate the transport position data based on at least one of the first amount of deviation and the second amount of deviation. The controller MC may control the transport device TU2 of the transfer module TF so that the workpiece W (or the measuring device 100) is transported based on the calibrated transport position data. In addition, the controller MC may calibrate the transport position data based on the third amount of deviation.

The controller MC may control the transport device TU2 such that the edge ring ER is transported based on the calibrated transport position data when the edge ring ER is replaced. In this case, electrostatic capacitance measurement may be performed by the measuring device 100 in order to confirm the transport position of the replaced edge ring ER. That is, after the edge ring ER is replaced, the controller MC controls the transport device TU2 such that the measuring device 100 is mounted in the mounting region of the mounting area on the electrostatic chuck ESC surrounded by the edge ring ER.

The controller MC may control the transport device TU2 such that the mounting position of the edge ring ER is changed based on the calibrated transport position data. The controller MC may control the lift pin 27a of the process module such that the lift pin 27a lifts the edge ring ER when the mounting position of the edge ring ER is changed. Then, the controller MC controls the transport device TU2 such that the transport device TU2 receives the edge ring ER lifted by the lift pin 27a. The controller MC may control the transport device TU2 such that the received edge ring ER is again mounted on the electrostatic chuck ESC based on the calibrated transport position data.

As described above, the measuring method according to one exemplary embodiment includes acquiring a temperature at the first time, and acquiring a first parameter for setting an admittance of the phase adjustment circuit 171d for reference point adjustment (zero point adjustment). The processor 174 acquires a reference parameter (second parameter) for setting the admittance of the phase adjustment circuit 171d corresponding to the temperature acquired at the first time. The reference parameter is acquired based on a reference parameter group (second parameter group) that is pre-stored. The processor 174 acquires a correction parameter group by correcting the reference parameter group to correspond to the first parameter based on the first parameter and the reference parameter. The processor 174 acquires a correction parameter corresponding to a temperature that is newly acquired by the temperature sensor 179 based on the correction parameter group at a second time after the first time. The processor 174 adjusts the voltage signal output from the C/V conversion circuit to the reference point by setting the admittance of the phase adjustment circuit 171d using the acquired correction parameter.

When plasma processing is performed in a semiconductor manufacturing apparatus, the mutual positional relationship between the workpiece W, the electrostatic chuck ESC, and the edge ring ER is important. Therefore, it is required to obtain highly reliable data indicating a position to which the workpiece W is transported. As an example, the measuring device 100 having the same shape as the workpiece W is transported, so that data indicating the mutual positional relationship between the transported measuring device 100, the electrostatic chuck ESC, and the edge ring ER may be acquired.

In the measuring device 100, a plurality of phase adjustment circuits 171d are connected between a plurality of sensor electrodes and the radio frequency oscillator 171. Therefore, the admittance of the phase adjustment circuit 171d is adjusted so that magnitudes of voltage signals output from a plurality of C/V conversion circuits 172 may be adjusted. However, the magnitudes of the voltage signals output from the C/V conversion circuits 172 may fluctuate due to the ambient temperature. For example, even if zero point adjustment is performed at a certain temperature, the voltage signals output from the C/V conversion circuits 172 may increase when the temperature changes.

Therefore, for example, it is conceivable to adjust the admittance of the phase adjustment circuit 171d corresponding to each of the plurality of C/V conversion circuits by using the parameter corresponding to the temperature detected by the temperature sensor 179. That is, the parameters corresponding to the plurality of temperatures can be acquired in advance, so that the parameters corresponding to the detected temperatures can be used to adjust the admittance.

However, even if the same parameters are used under an environment in which the temperature, humidity, and the like are reproduced when the parameters are acquired, the reference point adjustment may not be appropriately performed depending on a state of the measuring device 100 during measurement. For example, a cause thereof may be that characteristics of an electronic component, such as the variable capacitor 171c, fluctuate under the influence of humidity. In order to appropriately perform the reference point adjustment under an environment where the temperature during electrostatic capacitance measurement is not constant, it is conceivable to acquire a parameter group corresponding to the plurality of temperatures for each measurement.

In one exemplary embodiment, a correction parameter group, which is acquired by correcting the reference parameter group, is acquired based on reference point adjustment parameters that are acquired in advance during actual measurement and the reference parameter group that is acquired in advance. Since this correction parameter group corresponds to the parameter for reference point adjustment during measurement, an admittance can be adjusted according to a state of the measuring device at that time. When a parameter group corresponding to the plurality of temperatures is acquired for each measurement, not only is a heater or the like required for temperature adjustment, but also a long time is required for temperature adjustment. On the other hand, when the reference parameter group acquired in advance is corrected, the parameter group can be acquired in a short period of time without the need for temperature adjustment or the like.

In one exemplary embodiment, in the step of acquiring the correction parameter group, a difference between the reference point adjustment parameter acquired during actual measurement and the reference parameter may be calculated, the reference parameter group may be adjusted using the calculated difference. With this configuration, it is possible to uniformly correct a plurality of reference parameters that are elements of the reference parameters.

In one exemplary embodiment, in the acquiring of the reference parameter, the reference parameter corresponding to the temperature acquired at the first time may be acquired based on data, which is acquired by linear interpolating the plurality of reference parameters constituting the reference parameter group. With this configuration, even if a large amount of data is not acquired as the reference parameter group, the reference parameter can be acquired based on data that is linearly interpolated between data, so that the number of elements constituting the reference parameter group can be reduced.

In one exemplary embodiment, the reference parameter group may be acquired by the measuring device under an environment with a humidity of 10% or less for one day or longer. With this configuration, the reference parameter group can be acquired in a state similar to a usage environment of the measuring device 100. That is, the difference between the parameter for reference point adjustment acquired during actual measurement and the reference parameter can be reduced.

In one exemplary embodiment, the transfer module TM may have the edge ring ER disposed on the stage ST, which is replaceable with another edge ring ER. The one or more control devices can control the transfer module TM such that the measuring device 100 is mounted in a region surrounded by the other edge ring ER on the stage ST after replacing the edge ring ER with the other edge ring ER. In this configuration, the transport position of the edge ring ER is confirmed by the measuring device 100 after the edge ring ER is replaced.

In one exemplary embodiment, the measuring device 100 may be kept in a dehumidified environment within the chamber 5*a* of the keeping device 5. With this configuration, the measuring device 100 can be kept in a state similar to the usage environment.

In one exemplary embodiment, the one or more control devices may obtain an amount of deviation of the center of the measuring device 100 relative to the center of the edge ring ER, based on the calculated measurement values representing electrostatic capacitance. The one or more control devices may calibrate transport position data based on the amount of deviation and control the transfer module TM such that the workpiece W is transported based on the calibrated transport position data. With this configuration, accuracy of the transport position by the transfer module TM is enhanced.

In one exemplary embodiment, the one or more control devices may obtain an amount of deviation of the center of the measuring device 100 relative to the center of the mounting region, based on the calculated measurement values representing electrostatic capacitance. The one or more control devices may calibrate transport position data based on the amount of deviation and control the transfer module TM such that the workpiece W is transported based on the calibrated transport position data. With this configuration, accuracy of the transport position by the transfer module TM is enhanced.

In one exemplary embodiment, the one or more control devices may obtain an amount of deviation of the center of the edge ring ER relative to the center of the mounting region, based on the calculated measurement values representing electrostatic capacitance. The one or more control devices may calibrate the transport position data based on the amount of deviation, and control the transfer module TM such that a mounting position of the edge ring ER is changed based on the calibrated transport position data. With this configuration, accuracy of the transport position by the transfer module TM is enhanced.

In one exemplary embodiment, the process module may include the lift pin 27*a* that lifts the edge ring ER. The one or more control devices may control the process module such that the lift pin 27*a* lifts the edge ring ER when the mounting position of the edge ring ER is changed. The one or more control devices may control the transfer module TM to receive the edge ring ER lifted by the lift pin 27*a* and remount the received edge ring ER on the stage ST based on the calibrated transport position data. With this configuration, accuracy of the transport position of the edge ring ER is enhanced.

Although various exemplary embodiments are described above, without being limited to the exemplary embodiments described above, various omissions, substitutions, and changes may be made. In addition, elements from different embodiments can be combined to form other embodiments.

For example, in the description of the operation of measuring device 100, an example of adjusting the constants a and b in step ST9 has been described, but step ST9 may be omitted.

Further, the usage environment of the measuring device 100 is not limited to the temperature environment of 20° C. to 80° C. The lower limit of the temperature environment may be lower than 20° C., and the upper limit of the temperature environment may be higher than 80° C. The correction parameter group stored in the measuring device 100 may correspond to the temperature according to the usage environment of measuring device 100.

In addition, as a method for acquiring a table to control the variable resistor 171*b* or the variable capacitor 171*c*, an example of adjusting the variable resistor 171*b* or the variable capacitor 171*c* in a state where there is no object to be detected by the measuring device 100 has been described, but the same method is not limited thereto. For example, when the detection value output by each sensor under specific conditions is known, the variable resistor 171*b* and the variable capacitor 171*c* may be adjusted such that the digital value output by the sensor coincides with the known detection value.

In the above example, the resistance value of the variable resistor 171*b* and the electrostatic capacitance value of the variable capacitor 171*c* are controlled in order to adjust the admittance of the phase adjustment circuit 171*d*. In another example, the admittance may be adjusted by adjusting an amount of current flowing into the variable resistor 171*b* or the variable capacitor 171*c*. In this case, instead of the variable resistor 171*b* and the variable capacitor 171*c*, the phase adjustment circuit 171*d* may have a fixed resistor and a fixed capacitor.

In the above example, an example that the keeping device 5 is installed adjacent to the loader module LM has been described, but for example, one of the process modules may be used as the keeping device. In addition, like the process module, the keeping device may be airtightly connected to the transfer module TF via the gate valve. When the keeping device is connected to the transfer module TF, in step ST5, the measuring device 100 can be transferred to the process module under the dehumidified vacuum environment while maintaining the dehumidified environment. For example, one of containers (FOUP) for accommodating the workpiece W may be used as the keeping device. Furthermore, the keeping device may be disposed separately from the processing system.

Further, an example of acquiring the parameter for reference point adjustment under the dehumidified environment has been described, but the environment in which the parameters are acquired is not particularly limited.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the aspects following claims.

What is claimed is:

1. A method for measuring electrostatic capacitance between a measuring device and an object, in which the measuring device includes:
a disc-shaped base board;
a sensor electrode provided on the base board;

a temperature sensor provided on the base board;
a radio frequency oscillator provided to apply a radio frequency signal to the sensor electrode;
a C/V conversion circuit configured to generate a voltage signal corresponding to electrostatic capacitance formed by the sensor electrode; and
a phase adjustment circuit connected between the sensor electrode and the radio frequency oscillator,
in which the C/V conversion circuit has an amplifier circuit including an operational amplifier, and
the radio frequency oscillator is connected to a non-inversion input terminal of the operational terminal such that the radio frequency signal is input to the non-inversion input terminal, and is connected to an inversion input terminal of the operational amplifier via the phase adjustment circuit, the measuring method comprising:
acquiring a temperature by the temperature sensor at a first time, and acquiring a first parameter that sets an admittance of the phase adjustment circuit in order to adjust the voltage signal output from the C/V conversion circuit to a reference point;
acquiring a second parameter that sets an admittance of the phase adjustment circuit corresponding to the temperature acquired at the first time, based on a second parameter group that is pre-stored and sets an admittance of the phase adjustment circuit by corresponding to each of a plurality of temperatures in order to adjust the voltage signal output from the C/V conversion circuit to the reference point;
acquiring a correction parameter group by correcting the second parameter group to correspond to the first parameter based on the first parameter and the second parameter; and
acquiring a correction parameter corresponding to a temperature, which is newly acquired by the temperature sensor, based on the correction parameter group at a second time after the first time, and adjusting the voltage signal output from the C/V conversion circuit to a reference point by setting the admittance of the phase adjustment circuit using the acquired correction parameter.

2. The measuring method according to claim 1, wherein in the acquiring of the correction parameter group, a difference between the first parameter and the second parameter is calculated, and a plurality of parameters corresponding to the plurality of temperatures constituting the second parameter group are adjusted using the calculated difference.

3. The measuring method according to claim 1, wherein in the acquiring of the second parameter, the second parameter corresponding to the temperature acquired at the first time is acquired based on data, which is acquired by linearly interpolating a plurality of parameters corresponding to the plurality of temperatures constituting the second parameter group.

4. The measuring method according to claim 1, wherein the second parameter group is acquired by the measuring device under an environment with humidity of 10% or less for one day or longer.

5. A measuring device comprising:
a disc-shaped base board;
a sensor electrode provided on the base board;
a temperature sensor provided on the base board;
a radio frequency oscillator provided to apply a radio frequency signal to the sensor electrode;
a C/V conversion circuit configured to generate a voltage signal corresponding to electrostatic capacitance formed by the sensor electrode;
an A/D converter configured to convert the voltage signal output from the C/V conversion circuit into a digital value;
an arithmetic device configured to calculate a measurement value representing the electrostatic capacitance formed by the sensor electrode, based on the digital value output from the A/D converter; and
a phase adjustment circuit connected between the sensor electrode and the radio frequency oscillator,
wherein the C/V conversion circuit has an amplifier circuit including an operational amplifier,
the radio frequency oscillator is connected to a non-inversion input terminal of the operational amplifier such that the radio frequency signal is input to the non-inversion input terminal, and is connected to an inversion input terminal of the operational amplifier via the phase adjustment circuit, and
the arithmetic device
acquires a temperature by the temperature sensor at a first time, and acquires a first parameter that sets an admittance of the phase adjustment circuit in order to adjust the voltage signal output from the C/V conversion circuit to a reference point,
acquires a second parameter that sets an admittance of the phase adjustment circuit corresponding to the temperature acquired at the first time, based on a second parameter group that is pre-stored and sets an admittance of the phase adjustment circuit by corresponding to each of a plurality of temperatures in order to adjust the voltage signal output from the C/V conversion circuit to the reference point,
acquires a correction parameter group by correcting the second parameter group to correspond to the first parameter based on the first parameter and the second parameter, and
acquires a correction parameter corresponding to a temperature, which is newly acquired by the temperature sensor, based on the correction parameter group at a second time after the first time, and adjusts the voltage signal output from the C/V conversion circuit to a reference point by setting the admittance of the phase adjustment circuit using the acquired correction parameter.

6. A measuring system in which a measurement value representing electrostatic capacitance is acquired by a measuring device in a chamber of a processing system, the measuring system comprising: the processing system; the measuring device; and one or more control devices configured to control operations of the processing system and the measuring device,
wherein the processing system includes:
a process module including a chamber body providing a first chamber, a stage provided in the first chamber and having the measuring device mounted thereon, and an edge ring disposed on the stage and mounted to surround a mounting region where the measuring device is mounted;
a transfer module airtightly connected to the process module and including a decompression chamber configured to be decompressed and a transport device provided in the decompression chamber to transport the measuring device based on transport position data; and a keeping device airtightly connected to the decompression chamber and including a second chamber keeping the measuring device therein, the measuring device includes:
- a disc-shaped base board;
- a sensor electrode provided on the base board;
- a temperature sensor provided on the base board;
- a radio frequency oscillator provided to apply a radio frequency signal to the sensor electrode;
- a C/V conversion circuit configured to generate a voltage signal corresponding to electrostatic capacitance formed by the sensor electrode;
- an A/D converter configured to convert the voltage signal output from the C/V conversion circuit into a digital value; and
- a phase adjustment circuit connected between the sensor electrode and the radio frequency oscillator, the C/V conversion circuit has an amplifier circuit including an operational amplifier, the radio frequency oscillator is connected to a non-inversion input terminal of the operational amplifier such that the radio frequency signal is input to the non-inversion input terminal, and is connected to an inversion input terminal of the operational amplifier via the phase adjustment circuit, and the one or more control devices
- acquire a temperature by the temperature sensor at a first time, and acquires a first parameter that sets an admittance of the phase adjustment circuit in order to adjust the voltage signal output from the C/V conversion circuit to a reference point,
- acquire a second parameter that sets an admittance of the phase adjustment circuit corresponding to the temperature acquired at the first time, based on a second parameter group that is pre-stored and sets an admittance of the phase adjustment circuit by corresponding to each of a plurality of temperatures in order to adjust the voltage signal output from the C/V conversion circuit to the reference point,
- acquire a correction parameter group by correcting the second parameter group to correspond to the first parameter based on the first parameter and the second parameter,
- acquire a correction parameter corresponding to a temperature, which is newly acquired by the temperature sensor, based on the correction parameter group at a second time after the first time, and adjusts the voltage signal output from the C/V conversion circuit to a reference point by setting the admittance of the phase adjustment circuit using the acquired correction parameter, and
- calculate the measurement value representing the electrostatic capacitance formed by the sensor electrode based on the digital value output from the A/D converter, in a state where the voltage signal output from the C/V conversion circuit is adjusted to the reference point.

7. The measuring system according to claim 6, wherein the one or more control devices calculate a difference between the first parameter and the second parameter when the correction parameter group is acquired, and adjust a plurality of parameters corresponding to a plurality of temperatures constituting the second parameter group by using the calculated difference.

8. The measuring system according to claim 6, wherein the one or more control devices acquire the second parameter corresponding to the temperature acquired at the first time based on data, which is acquired by linearly interpolating a plurality of parameters corresponding to a plurality of temperatures constituting the second parameter group.

9. The measuring system according to claim 6, wherein the second parameter group is acquired by the measuring device under an environment with humidity of 10% or less for one day or longer.

10. The measuring system according to claim 6, wherein the transfer module is configured to replace the edge ring disposed on the stage with another edge ring, and
the one or more control devices control the transfer module such that the measuring device is mounted in a region surrounded by the other edge ring on the stage after the edge ring is replaced with the other edge ring.

11. The measuring system according to claim 6, wherein the measuring device is kept under a dehumidified environment in the second chamber of the keeping device.

12. The measuring system according to claim 6, wherein the one or more control devices obtain an amount of deviation of a center of the measuring device with respect to a center of the edge ring based on the measurement value representing the calculated electrostatic capacitance, and calibrate the transport position data based on the amount of deviation to control the transfer module such that a workpiece is transported based on the calibrated transport position data.

13. The measuring system according to claim 6, wherein the one or more control devices obtain an amount of deviation of a center of the measuring device with respect to a center of the mounting region based on the measurement value representing the calculated electrostatic capacitance, and calibrate the transport position data based on the amount of deviation to control the transfer module such that a workpiece is transported based on the calibrated transport position data.

14. The measuring system according to claim 6, wherein the one or more control devices obtain an amount of deviation of a center of the edge ring with respect to a center of the mounting region based on the measurement value representing the calculated electrostatic capacitance, and calibrate the transport position data based on the amount of deviation to control the transfer module such that a mounting position of the edge ring is changed based on the calibrated transport position data.

15. The measuring system according to claim 14, wherein the process module includes a lift pin configured to lift the edge ring, and
the one or more control devices
- control the process module such that the lift pin lifts the edge ring when the mounting position of the edge ring is changed, and
- control the transfer module to receive the edge ring lifted by the lift pin and remount the received edge ring on the stage based on the calibrated transport position data.

* * * * *